United States Patent
Huff et al.

(10) Patent No.: US 9,576,773 B2
(45) Date of Patent: Feb. 21, 2017

(54) METHOD FOR ETCHING DEEP, HIGH-ASPECT RATIO FEATURES INTO GLASS, FUSED SILICA, AND QUARTZ MATERIALS

(71) Applicant: Corporation For National Research Initiatives, Reston, VA (US)

(72) Inventors: Michael A. Huff, Oakton, VA (US); Michael Pedersen, Ashton, MD (US)

(73) Assignee: CORPORATION FOR NATIONAL RESEARCH INITIATIVES, Reston, VA (US)

( * ) Notice: Subject to any disclaimer, the term of this patent is extended or adjusted under 35 U.S.C. 154(b) by 9 days.

(21) Appl. No.: 13/954,057

(22) Filed: Jul. 30, 2013

(65) Prior Publication Data

US 2015/0034592 A1 Feb. 5, 2015

(51) Int. Cl.
*C03C 15/00* (2006.01)
*H01J 37/32* (2006.01)
(Continued)

(52) U.S. Cl.
CPC ........ *H01J 37/3211* (2013.01); *B81C 1/00619* (2013.01); *C03C 15/00* (2013.01);
(Continued)

(58) Field of Classification Search
CPC .................... H01J 2237/3347; H01J 37/3211; H01L 21/31116; H01L 21/31144
(Continued)

(56) References Cited

U.S. PATENT DOCUMENTS 5,001,085 A * 3/1991 Cathey ................ H01L 21/3065
148/DIG. 105
6,153,504 A * 11/2000 Shields ................... H01L 24/11
257/E21.267
(Continued)

FOREIGN PATENT DOCUMENTS

WO  WO 02097874 A1 * 12/2002

OTHER PUBLICATIONS

Machine Translation of Yang et al. (CN 101852893), retrieved Sep. 19, 2016.*

*Primary Examiner* — Nadine Norton
*Assistant Examiner* — Christopher Remavege
(74) *Attorney, Agent, or Firm* — Nixon & Vanderhye PC

(57) ABSTRACT

A method or process is disclosed for etching deep, high-aspect ratio features into silicon dioxide material layers and substrates, including glass, fused silica, quartz, or similar materials, using a plasma etch technology. The method has application in the fabrication and manufacturing of MEMS, microelectronic, micro-mechanical, photonic and nanotechnology devices in which silicon dioxide material layers or substrates are used and must be patterned and etched. Devices that benefit from the method described in this invention include the fabrication of MEMS gyroscopes, resonators, oscillators, microbalances, accelerometers, for example. The etch method or process allows etch depths ranging from below 10 microns to over 1 millimeter and aspect ratios from less than 1 to 1 to over 10 to 1 with etched feature sidewalls having vertical or near vertical angles. Additionally, the disclosed method provides requirements of the etched substrates to reduce or eliminate undesired effects of an etch.

192 Claims, 13 Drawing Sheets

(51) Int. Cl.
*H01L 21/311* (2006.01)
*B81C 1/00* (2006.01)

(52) U.S. Cl.
CPC .. *H01L 21/31116* (2013.01); *H01L 21/31144* (2013.01); *C03C 2218/34* (2013.01); *H01J 2237/3347* (2013.01)

(58) Field of Classification Search
USPC ........ 216/67, 68, 41, 59, 17, 58, 63, 72, 79, 69,216/70, 99; 438/710, 706, 719, 723, 725, 700, 438/714, 743, 9
See application file for complete search history.

(56) References Cited

U.S. PATENT DOCUMENTS

| | | | |
|---|---|---|---|
| 6,391,790 B1* | 5/2002 | Stoehr | H01L 21/31116 216/12 |
| 7,879,510 B2* | 2/2011 | Anderson | G03F 1/30 216/3 |
| 7,888,267 B2* | 2/2011 | Ko | H01J 37/32091 216/47 |
| 2003/0228768 A1* | 12/2003 | Chae et al. | 438/710 |
| 2008/0292976 A1* | 11/2008 | Terasaki et al. | 430/5 |
| 2009/0139540 A1* | 6/2009 | Lau | 134/1.1 |
| 2009/0191715 A1* | 7/2009 | Hayashi | 438/710 |
| 2014/0099491 A1* | 4/2014 | Ameen | C23C 14/0021 428/220 |
| 2014/0166618 A1* | 6/2014 | Tadigadapa | H01J 37/32357 216/67 |

\* cited by examiner

| Etch Process Parameter | Units of Process Parameter |
|---|---|
| Radio Frequency (RF) Bias Power | Watts |
| Substrate chuck temperature | Degrees-Celcius |
| O2 gas flow | Standard Cubic Centimeters per Minute (sccm) |
| Chamber pressure | Milli-Torr |
| C3F8 gas flow | Chamber cleaning history |
| Etch cycle time | Hours, Minutes, Seconds |
| O2 clean cycle time | Hours, Minutes, Seconds |
| Radio Frequency (RF) antenna power | Watts |
| Top magnet current | Amps |
| Center magnet current | Amps |
| Bottom magnet current | Amps |
| Heat shield temperature | Degrees-Celcius |
| He cooling pressure | Pascals |
| Chamber cleaning history | Number of wafers etched between cleans |

Figure 6

| DOE wafer metrology parameters | | |
|---|---|---|
| Parameter | Parameter name | Derived from |
| A | Initial etch mask thickness | Optical profilometry 10 points per wafer |
| B | Fused silica etch depth | Cross-section analysis |
| C | Etch mask top lateral erosion variation | Optical microscopy Std deviation/Average 30 points per wafer |
| D | Fused silica etch rate | "B" divided by etch time |
| E | Mask selectivity | "B" divided by "F" |
| F | Etch mask vertical etch rate | Optical profilometry & SEM analysis divided by etch time |
| G | Etch mask horizontal etch rate | Optical microscopy divided by etch time |
| H | Etch mask horizontal/vertical etch rate | "G" divided by "F" |
| I | Etch mask removed @ bottom of mask | SEM analysis |
| J | Polymer thickness | SEM analysis |
| K | Top-to-center sidewall angle | Cross-section analysis |
| L | Center-to-bottom sidewall angle | Cross-section analysis |
| M | Top-to-bottom sidewall angle | Cross-section analysis |
| N | Top hat depth | Cross-section analysis |
| O | Top hat width | Cross-section analysis |
| P | Top hat slope | Cross-section analysis |
| Q | Etch depth uniformity | Compare die #5 and #8 |
| R | Etch quality | Optical microscopy (die #4) |

Figure 7

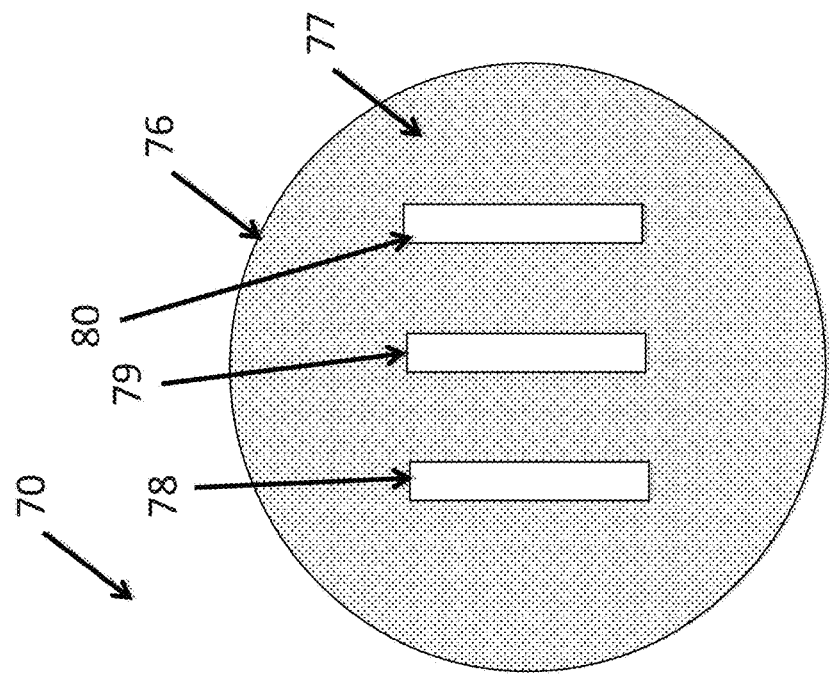
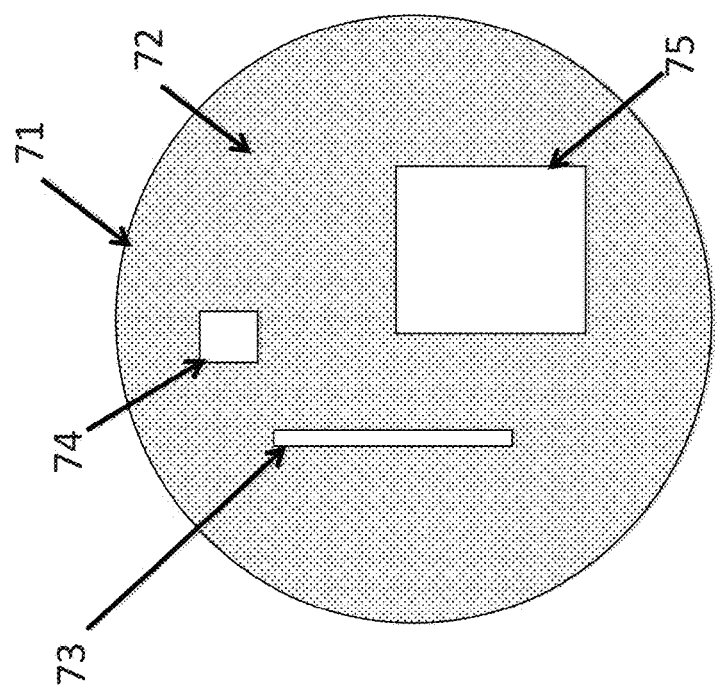
Figure 10 (a)
Figure 10 (b)

METHOD FOR ETCHING DEEP, HIGH-ASPECT RATIO FEATURES INTO GLASS, FUSED SILICA, AND QUARTZ MATERIALS

FIELD OF INVENTION

The present invention is directed the fabrication of MEMS, micro-mechanical, microelectronic, nanotechnology and photonic devices, and more specifically to a method for the etching of deep, high-aspect ratio features into silicon dioxide, including fused silica, quartz, glass and similar materials mostly comprised of silicon dioxide, using an Inductively-Coupled Plasma (ICP) etch process technology.

BACKGROUND OF THE INVENTION

Quartz and fused silica have many very desirable material properties, including: high quality factor, high stiffness, chemical inertness, high thermal stability, small visco-elastic losses, low thermal expansion, exceptionally good thermal shock resistance, low dielectric constant and low dielectric losses, good visible and UV transparency, low thermal conductivity, and many others, making these materials excellent choices for many MEMS, micro-mechanical, microelectronic, nanotechnology and photonic applications. Additionally, quartz is a crystalline form of silicon dioxide and therefore is a piezoelectric material making it a great material choice for sensor, actuator, and electronic applications. Likewise glass (silicon dioxide), whether it is pure or contains additives or dopants, and regardless of its crystal structure, also has many desirable properties for MEMS, microelectronic, nanotechnology and photonic device applications, such as low thermal, low electrical conductivity, and good stability.

Consequently, these materials are very attractive for many important commercial and defense applications, including resonators, gyroscopes, oscillators, microbalances, accelerometers, and many others in microelectronics, microsensors, MEMS, micro-mechanical, nanotechnology, and photonic technologies. However, the fabrication technologies to shape and form these materials have been mostly limited to 19$^{th}$ century-based technologies, such as crystal cutting, grinding, and wet etching techniques. While plasma etching of silicon dioxide has been around for several years, this technology has been limited to depths of a few microns or less, very limited aspect ratios, and typically non-vertical sidewalls of the etched features. Consequently, the ability to make deep, small-dimensioned devices and device features with high aspect ratio and vertical etched sidewalls in these important materials has not been available until the invention disclosed herein.

SUMMARY OF INVENTION

The present invention is directed to a method for the etching of deep, high-aspect ratio features into silicon dioxide, including fused silica, quartz, glass and similar materials mostly comprised of silicon dioxide using an Inductively-Coupled Plasma (ICP) etch process technology. This method has application in the fabrication and manufacturing of MEMS, microelectronic, micro-mechanical, photonic, nanotechnology devices, wherein a glass, fused silica, quartz material, or similar materials are used and must be patterned and etched and it is desired that the etched features have significant depths and/or near vertical sidewalls. One device example of importance that benefits from the method described in this invention is the fabrication of MEMS-based gyroscopes that are made from fused silica or quartz. Other device examples include: resonators and oscillators for communication and timing systems, microbalances for chemical and biological sensors, inertial sensors including accelerators, and many others.

BRIEF DESCRIPTION OF THE DRAWINGS

FIG. 6 is a table of the etch parameters of the etch process described herein.

FIG. 7 is a table of process characteristics derived from metrology of etched structures in the design-of-experiments (DOE) described herein.

FIGS. 10A and 10B are an illustration of two substrates with feature width to be etched that are dissimilar (a) or similar (b) as described herein.

DETAILED DESCRIPTION OF THE INVENTION

Figure 1:
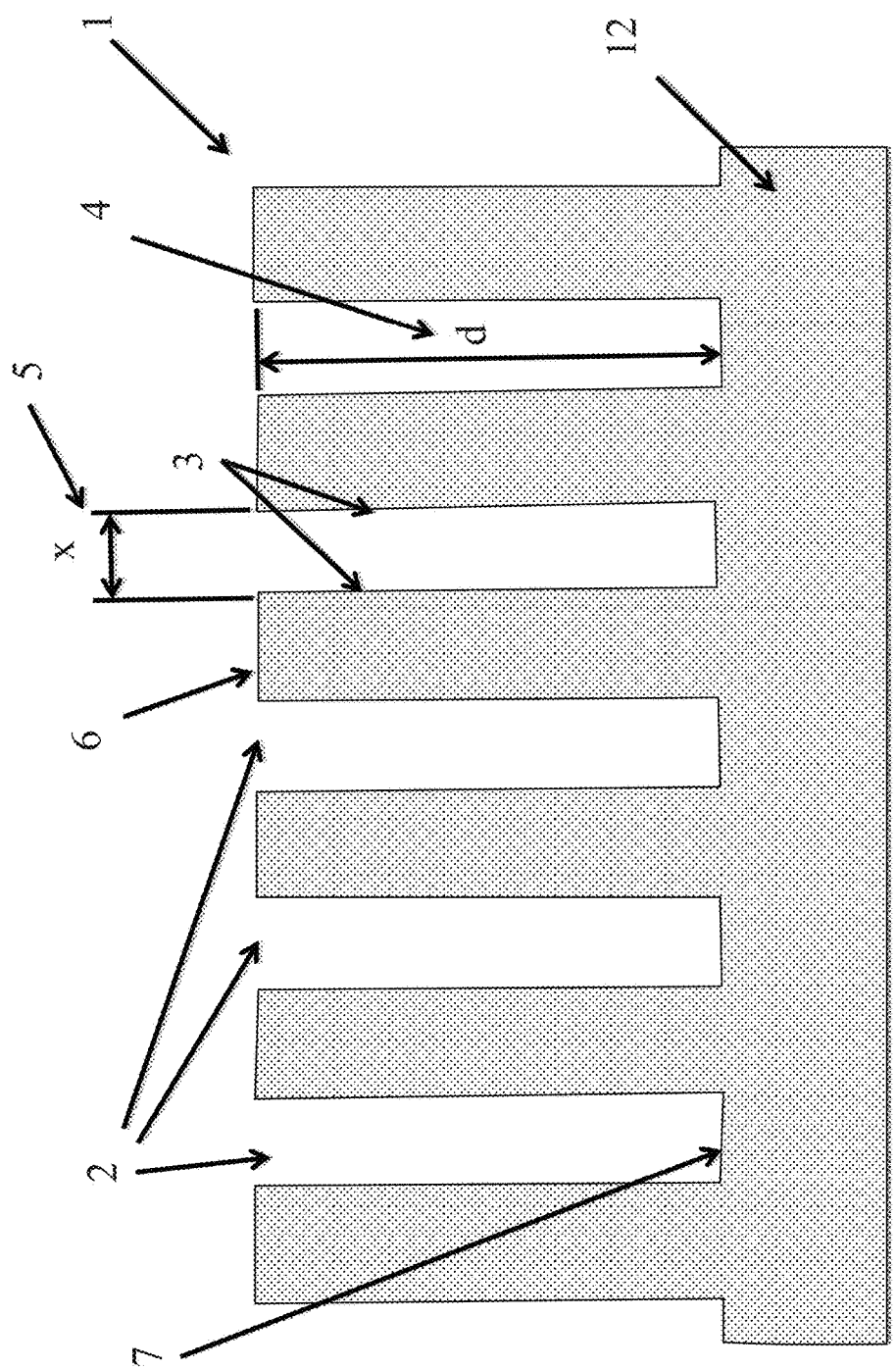
FIG. 1 is an illustration of a deep, high-aspect ratio feature etched into the materials, and using the method, described herein.

The present invention is directed to a method for etching of deep, high-aspect ratio features into silicon dioxide, including fused silica, quartz, glass and similar materials mostly comprised of silicon dioxide using an Inductively-Coupled Plasma (ICP) etch process technology. This method has application in the fabrication and manufacturing of MEMS, microelectronic, micro-mechanical, photonic, nanotechnology devices wherein a glass, fused silica, quartz material, or similar materials are used and must be patterned and etched and it is desired that the etched features have significant depths and/or near vertical sidewalls. One device example of importance that benefits from the method described in this invention is the fabrication of MEMS gyroscopes that are made from high-Q materials such as fused silica or quartz. Other device examples include: resonators and oscillators for communication and timing systems, microbalances for chemical and biological sensors, inertial sensors, including accelerators, and many others. The method of the present invention allows highly precise dimensional etching to shape and form materials made from silicon dioxide, including fused silica, quartz and glasses.

Quartz and fused silica have many very desirable material properties, including: high quality factor, high stiffness, chemical inertness, high thermal stability, small visco-elastic losses, low thermal expansion, exceptionally good thermal shock resistance, low dielectric constant and low dielectric losses, good visible and UV transparency, low thermal conductivity, and many others, making these materials excellent choices for many MEMS, microelectonic, nanotechnology and photonic applications. Additionally, quartz is a crystalline form of silicon dioxide and therefore is a piezoelectric material making it a great material choice for sensor, actuator, and electronic applications. Likewise glass (silicon dioxide), whether it is pure or contains additives or dopants, and regardless of its crystal structure, also has many desirable properties for MEMS, microelectronic, nanotechnology and photonic device applications, such as low thermal, low electrical conductivity, and good stability.

Consequently, these materials are very attractive for many important commercial and defense applications including resonators, gyroscopes, oscillators, microbalances, accelerometers, and many others in microelectronics, microsensors, MEMS, micro-mechanical, nanotechnology, and photonic technologies. However, the fabrication technologies to shape and form these materials have been mostly limited to 19$^{th}$ century-based technologies, such as crystal cutting, grinding, and wet etching techniques. While plasma etching of silicon dioxide has been around for a few years, this technology has been limited to depths of a few microns or less, very limited aspect ratios, and typically non-vertical sidewalls of the etched features. Consequently, the ability to make deep, small-dimensioned devices and device features with high aspect ratio and vertical etched sidewalls in these important materials has not been available until the invention disclosed herein.

The present invention is directed to a recipe (i.e., method) that can be used to etch high-aspect ratios features with vertical sidewalls into material layers or substrates comprised of either glass, fused silica, or quartz as small as a few microns or less. Additionally, the present invention also allows the etching of deep features into these materials. The method of the present invention is performed on an inductively-coupled plasma (ICP) reactive-ion etcher (RIE) system, which is a type of tool platform commonly used in micro- and nanofabrication.

FIG. 1 illustrates one result of the etching method of the present invention. A cross-section 1 of a substrate 12 is shown in the FIG. 1. Also shown in FIG. 1 are a number of high-aspect ratio trenches 2 that have nearly vertical sidewalls 3. An etch that results in vertical or near vertical sidewalls 3 of an etched trench 2 is often desirable and is regarded as having higher anisotropy compared to sidewalls that are sloping. Therefore the result shown in FIG. 1 would be considered as a very anisotropic etch. A vertical sidewall is defined as a wall with an angle of 90 degrees with respect to the etch plane. A near vertical sidewall is defined as a wall with an angle between 85 degrees and 95 degrees with respect to the etch plane. The depth 4 of the etched trenches 2 is given by the measurement from the top unetched portion 6 of the substrate 12 to the bottom 7 of the etched trenches 2 and is represented by depth 4 of d. The aspect ratio of these etched trenches 2 in this example etch result 1 is given by the ratio of the depth 4 of the etched trenches 2 and the width 5 of the trenches 2 given by x, or:

$$\text{Aspect Ratio}=d/x.$$

Although the etcher system design is not the basis of the present invention, it is worth reviewing the etcher system that can be used to perform the method of the present invention.

Figure 2:
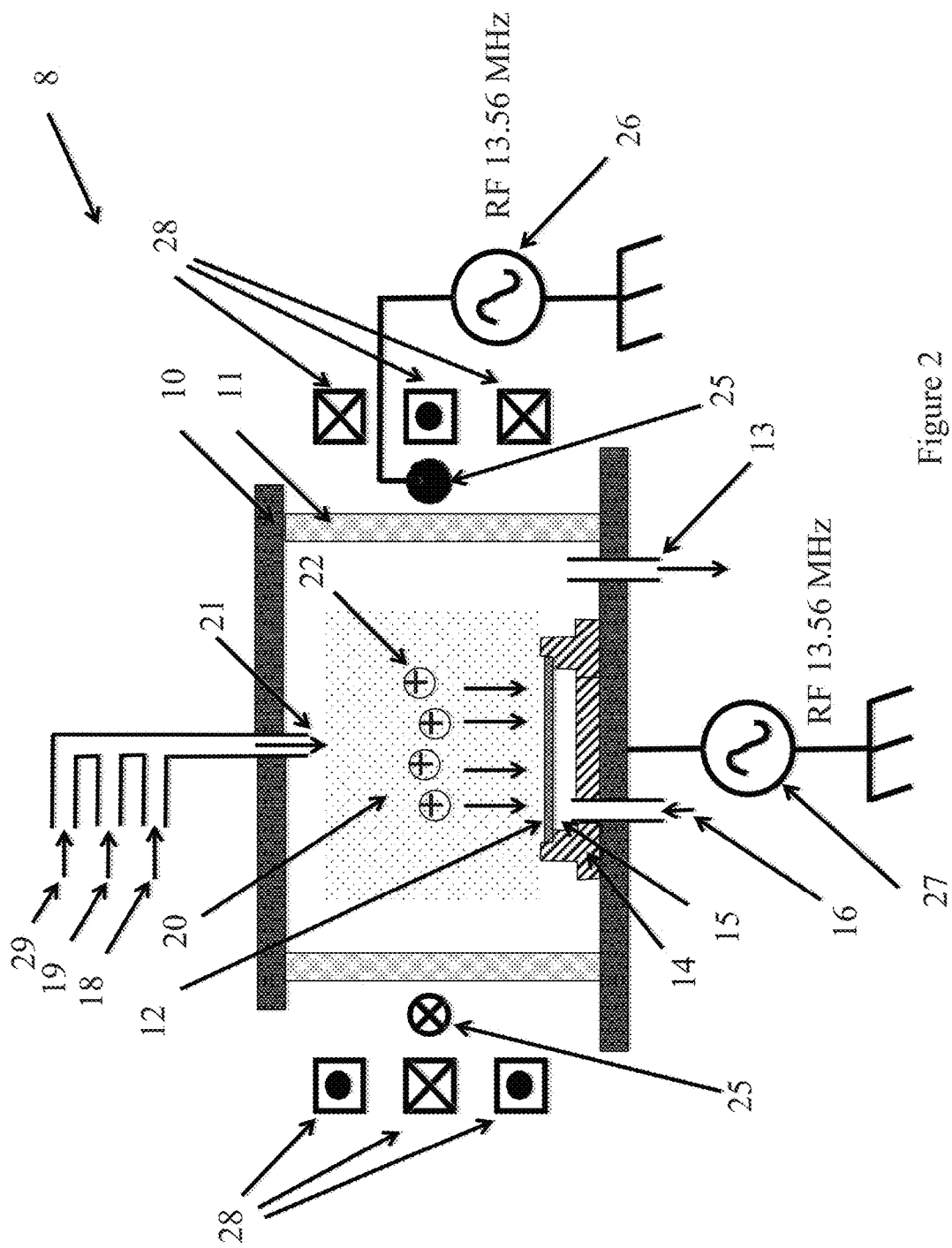
FIG. 2 is an illustration of the plasma etching system that uses the method of etching the materials described herein.

The basic diagram of the Inductively-Coupled Plasma (ICP) etcher system 8 is shown in FIG. 2. This etch system uses a chemically reactive gas plasma 20 that impinges on the surface of the substrate 12 to remove material from the substrate 12 that is being etched. A typical system configuration employs an etch chamber 10 that includes a quartz vessel 11. The etch chamber 10 is connected through tubing 13 to a vacuum pump so as to lower the pressure inside the chamber 10 below that of ambient pressure. The substrate 12 being etched is positioned on a chuck 14 that uses active cooling on the backside of the substrate 12 in order to control the temperature of the substrate 12 during etching. The actively cooled chuck 14 has a central cavity 15 where Helium gas is supplied to the cavity through an inlet port 16 and flows through the chuck cavity 15 to allow efficient heat transport from the substrate 12 to the Helium gas flowing through the cavity 15 in the chuck 14. Controlled amounts of process gases, including Perflouropropane ($C_3F_8$) 18 and Oxygen ($O_2$) 19, are introduced into the process etch chamber 10 through a gas inlet port 21 and a plasma 20 is generated by the interaction of the gases 18 and 19 with an applied Radio Frequency (RF) electromagnetic field created by a Radio Frequency (RF) coil 25 operating at a frequency of 13.56 MHz that is connected to a RF generator 26. Controlled amounts of an additional process gas that is Argon (Ar) 29 may also be introduced into the etch chamber 10 and also be initiated into a plasma 20 for specific desired etch results. The RF coil 25 completely encircles the etch chamber 10 and is positioned outside the etch chamber 10. High-energy ions 22 from the plasma 20 are accelerated to strike the substrate 12 surface by a separate Radio Frequency (RF) electromagnetic field created by a second RF generator 27 operating at 13.56 MHz frequency that is connected to the chuck 14 on which the substrate 12 is positioned during etching. Gases 18 and 19 and 29, if it is used, exit the process chamber 10 under the action of a vacuum pump connected to exit port 13. The types and amounts of gases 18, 19 and 29 used in an etch process depend on substrate 12 material being etched, as well as other desired process outcomes. The flow rates of these process gases 18, 19 and 29 are controlled by in-line mass flow controllers (not shown), which are standard in the industry.

Figure 3:
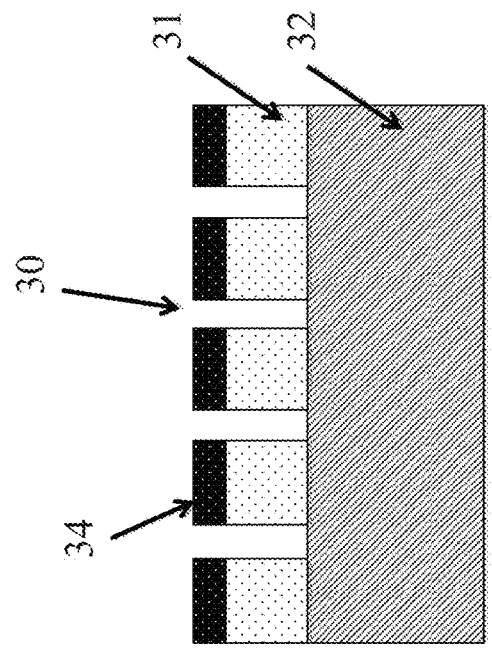
FIGS. 3A to 3D illustrate a first method to etch deep, high-aspect ratio features into a composite substrate according to the present invention.
Figure 3:
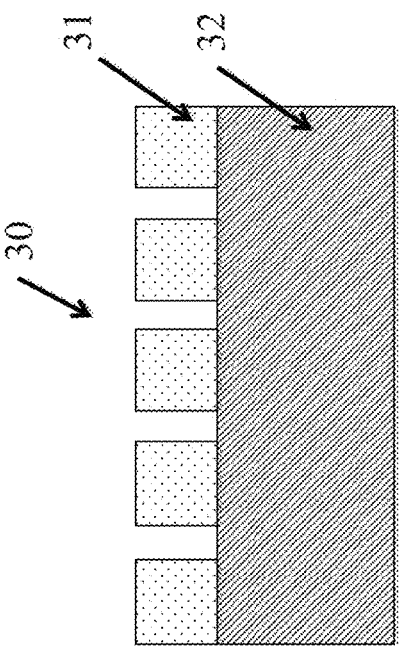
Figure 3:
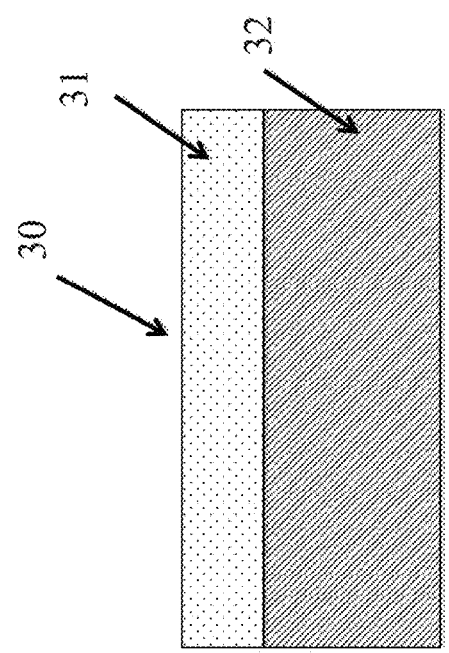
Figure 3:
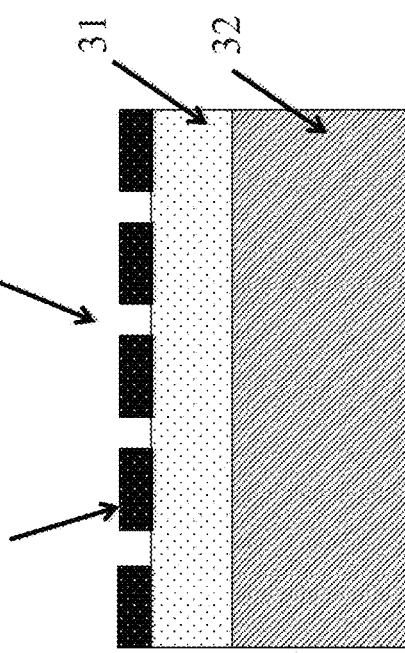

Inductively-Coupled Plasma (ICP) etchers 8 are a subcategory of RIE etch systems that achieve very high plasma 20 densities due to the plasma 20 being generated by a Radio Frequency (RF) electromagnetic field created by the external antenna 25 that is connected to a RF generator 26. When an Inductively-Coupled Plasma (ICP) etcher 5 is configured with a separate Radio Frequency (RF) electromagnetic field created by a RF generator 27 that is connected to the chuck 14 on which the substrate 12 is positioned during etching, high plasma 20 densities, low electron temperatures, low chamber 10 process pressures, and high levels of etch anisotropy in the substrate 12 surface can be obtained. For the etching system 8 used in the present invention, a high plasma density is defined as one above $1.2 \times 10^{11}$ cm$^{-3}$ with a plasma density of around $3 \times 10^{11}$ cm$^{-3}$ or higher being even more desirable, a low electron temperature is defined as below 4 eV with an electron temperature of around 2.5 eV, or lower being even more desirable, and a low chamber process pressure is defined as well below 0.67 Pascals with a chamber process pressure of 0.2 Pascals or lower being even more desirable. However, it should be noted that these plasma densities, electron temperatures, and process chamber pressures may vary, depending on the exact tool configuration and that these are only guidelines. The ICP etcher 8 may also use an electromagnetic neutral loop comprised of magnetic coils 28, which enables spatial redistribution of ions 22 in the plasma 20 to enhance etching uniformity FIGS. 3A to 3D, 4A to 4D and 5A to 5D illustrate the substrate configurations that can be etched by the method of the present invention. In FIG. 3a is shown a cross section of a portion of the substrate 30 of the first substrate configuration before performing the etch. The substrate 30 has a first material layer 31 of a predetermined thickness that is on top of a second material substrate 32 of a predetermined thickness. The first material layer 31 is comprised of silicon dioxide and can be one of the material types, including: quartz; fused silica; fused quartz; glass; borosilicate glass (Pyrex®), or any material layer that is mostly comprised of silicon dioxide. The first material layer 31 can have a complete crystal structure, a partial crystal structure, or be amorphous. Additionally the first material layer 31 can include additives or dopants of any type or amount.

The thickness of the first material layer 31 to be etched on the second material substrate 32 can range from below 1 micron to hundreds of microns, or even a few millimeters. The second material substrate 32 can have a thickness ranging from tens of microns to several millimeters.

The second material substrate 32 shown in FIGS. 3A to 3D can be a metal, semiconductor, silicon dioxide, or ceramic.

The types of metals that the second material substrate 32 can be made from include: copper; stainless steel; nickel; tungsten; brass; chrome; or titanium, as well as a combination of these materials that have been laminated or alloyed together, whether in single crystal or polycrystalline form.

The semiconductor materials that the second material substrate 32 can be made from include: silicon; germanium; silicon carbide; gallium arsenide; gallium nitride; lithium niobate; as well as any known semiconductor material, whether in single crystal or polycrystalline form.

The ceramic materials that the second material substrate 32 can be made from include: aluminum oxide, alumina, titanium nitride, tungsten carbide; chromium carbide; as well as any known ceramic material, whether in single crystal or polycrystalline form.

The silicon dioxide materials that the second material substrate 32 can be made from include: quartz; fused silica; fused quartz; glass; borosilicate glass (Pyrex®); or any material layer that is mostly comprised of silicon dioxide. The second material substrate 32 can have a complete crystal structure, a partial crystal structure, or be amorphous. Additionally the second material substrate 32 can include additives or dopants of any type or amount.

The first material layer 31 can be deposited onto the second material substrate 32 using a physical vapor deposition (PVD) process or a chemical vapor deposition (CVD) process. Alternatively, the first material layer 31 can also be bonded or affixed onto the second material substrate 32. The first material layer 31 can also be bonded or affixed onto the second material substrate 32 and then be lapped, grinded, and/or polished back to obtain a thinner thickness of the first material layer 31. This would be the case when the desired predetermined thickness of the first material layer 31 has a thickness that is thinner than can be easily handled prior to bonding or affixing it to the second material substrate 32.

FIG. 3B illustrates a cross section of a portion of the substrate 30 of the first configuration with a patterned third material layer 34 with a predetermined thickness on the surface of the first material layer 31 prior to the etch in the first material layer 31 having been performed. The patterned third material layer 34 functions as a etch mask during the etching of the first material layer 31. FIG. 3C illustrates a cross section of a portion of the substrate 30 of the first configuration after the etch of the silicon dioxide first material layer 31 has been performed. In this illustration, the trench is etched completely through the first material layer 31. It is noted that the etch in the first material layer 31 can be performed through a portion of the first material layer 31, or completely through the first material layer 31, as shown in FIG. 3C, depending on the depths desired for any given device design and application. FIG. 3D illustrates a cross section of a portion of the substrate 30 of the first configuration after the patterned third material layer 34 that functioned as an etch mask has been removed.

Figure 4:
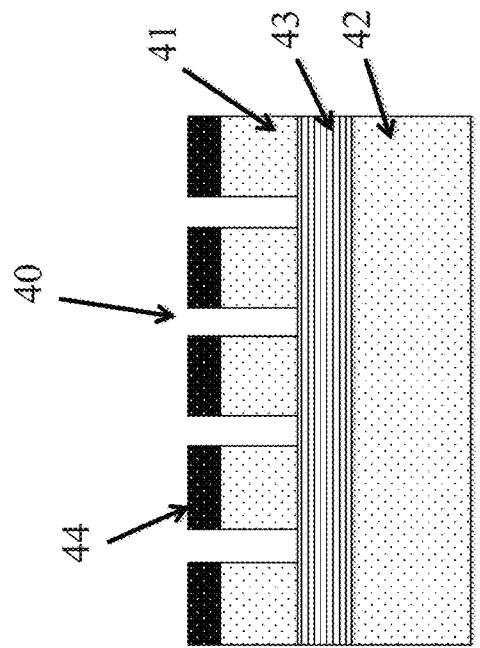
FIGS. 4A to 4D illustrate a second method to etch deep, high-aspect ratio features into a composite substrate according to the present invention.
Figure 4:
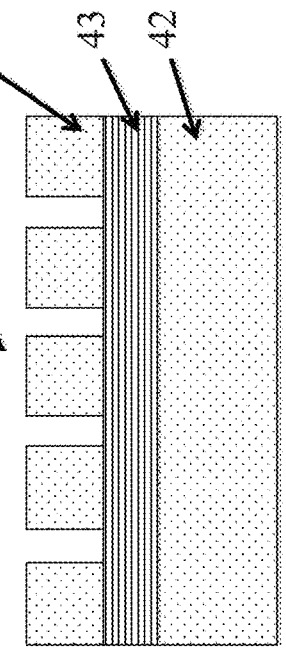
Figure 4:
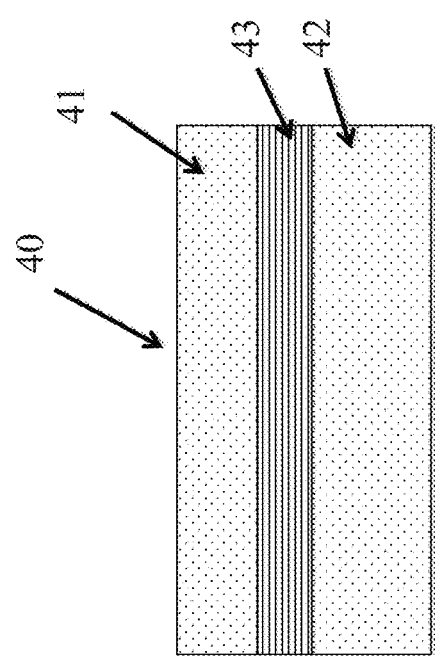
Figure 4:
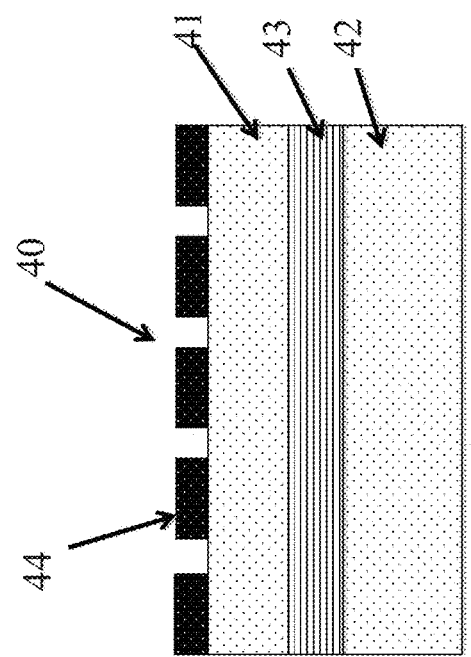

In FIG. 4A is shown a cross section of a portion of the substrate 40 of the second substrate configuration before performing the etch. The substrate 40 has a first material layer 41 having a predetermined thickness that is on top of a fourth material layer 43 also having a predetermined thickness, and both of these material layers 41 and 43 are on top of a second material substrate 42 that has a predetermined thickness.

The first material layer 41 is comprised of silicon dioxide and can be one of the material types, including: quartz; fused silica; fused quartz; glass; borosilicate glass (Pyrex®); or any material layer that is mostly comprised of silicon dioxide. The first material layer 41 can have a complete crystal structure, a partial crystal structure, or be amorphous. Additionally, the first material layer 41 can include additives or dopants of any type or amount.

The thickness of the first material layer 41 to be etched can range from below 1 micron to hundreds of microns, or even a few millimeters. The second material substrate 32 can have a thickness ranging from tens of microns to several millimeters. The fourth material layer 43 can have a thickness ranging from less than 1 micron to several millimeters.

The second material substrate 42 shown in FIGS. 4A to 4D can be a metal, semiconductor, silicon dioxide, or ceramic.

The types of metals that the second material substrate 42 can be made from include: copper; stainless steel; nickel; tungsten; brass; or titanium, as well as a combination of these materials that have been laminated or alloyed together, whether in single crystal or polycrystalline form.

The semiconductor materials that the second material substrate 42 can be made from include: silicon; germanium; silicon carbide; gallium arsenide; gallium nitride; lithium niobate; as well as any known semiconductor material, whether in single crystal or polycrystalline form.

The ceramic materials that the second material substrate 42 can be made from include: aluminum oxide, alumina, titanium nitride, tungsten carbide; chromium carbide; as well as any known ceramic material, whether in single crystal or polycrystalline form.

The silicon dioxide materials that the second material substrate 42 can be made from include: quartz; fused silica; fused quartz; glass; borosilicate glass (Pyrex®); or any material layer that is mostly comprised of silicon dioxide. The second material substrate 42 can have crystal structure, some crystal structure, or be amorphous. Additionally, the second material substrate 42 can include additives or dopants of any type or amount.

The first material layer 41 can be deposited onto the fourth material layer 43 using a physical vapor deposition (PVD) process or a chemical vapor deposition (CVD) process. Alternatively, the first material layer 41 can also be bonded or affixed onto the fourth material layer 43. The first material layer 41 can also be bonded or affixed onto the fourth material layer 43 and then be lapped, grinded, and/or polished back to obtain a thinner thickness of the first material layer 41. This would be the case when the desired predetermined thickness of the first material layer 41 has a thickness that is thinner than can be easily handled prior to bonding or affixing it to the fourth material layer 43.

The fourth material layer 43 shown in FIGS. 4A to 4D can be a metal, semiconductor, silicon dioxide, or ceramic.

The types of metals that the fourth material layer 43 can be made from include: copper; stainless steel; nickel; tungsten; brass; chrome; or titanium, as well as a combination of these materials that have been laminated or alloyed together, whether in single crystal or polycrystalline form.

The semiconductor materials that the fourth material layer 43 can be made from include: silicon; germanium; silicon carbide; gallium arsenide; gallium nitride; lithium niobate; as well as any known semiconductor material, whether in single crystal or polycrystalline form.

The ceramic materials that the fourth material layer 43 can be made from include: aluminum oxide, alumina, titanium nitride, tungsten carbide; chromium carbide; as well as any known ceramic material, whether in single crystal or polycrystalline form.

The silicon dioxide materials that the fourth material layer 43 can be made from include: quartz; fused silica; fused quartz; glass; borosilicate glass (Pyrex®); or any material layer, the majority of which is comprised of silicon dioxide. The fourth material layer 43 can have crystal structure, some crystal structure, or be amorphous. Additionally, the fourth material layer 43 can include additives or dopants of any type or amount.

The fourth material layer 43 can be deposited onto the second material substrate 42 using a physical vapor deposition (PVD) process or a chemical vapor deposition (CVD) process. Alternatively, the fourth material layer 43 can also be bonded or affixed onto the second material substrate 42. The fourth material layer 43 can also be bonded or affixed onto the fourth material layer 43 and then be lapped, grinded, and/or polished back to obtain a thinner thickness of the fourth material layer 43. This would be the case when the desired predetermined thickness of the fourth material layer 43 has a thickness that is thinner than can be easily handled prior to bonding or affixing it to the second material substrate 42.

In one embodiment of the present invention, the second material substrate 42 can be made of fused silica, quartz, or glass, with an intermediate layer of silicon as the fourth material layer 43, with a top first material layer 41 of fused silica or quartz on top of the fourth material layer 43. The first material layer 41 can be etched using the method of the present invention. Importantly, the material combinations of the composite stacks can be of any type, including glasses, semiconductors, ceramics and metals, as long as the topmost material layer is either glass, fused silica or quartz.

As shown in FIG. 4A, the fourth material layer 43 can also be comprised of two or more material layers that are located on top of a second material substrate 42. These layers can be comprised of any type or combination of semiconductor, metal, silicon dioxide, or ceramic.

FIG. 4B illustrates a cross section of a portion of the substrate 40 of the second substrate configuration with a patterned hard mask layer 44 on the surface of the first material layer 41 prior to the etch in the first material layer 41 having been performed. FIG. 4C illustrates a cross section of a portion of the substrate 40 of the second substrate configuration after the etch of the silicon dioxide first material layer 41 has been performed. In this illustration, the trench was etched completely through the first material layer 41. It is noted that the etch in the first material layer can be performed through a portion of the first material layer 41, or completely through the first material layer 41, as shown in FIG. 4C, depending on the depths desired for any given device design and application. FIG. 4D illustrates a cross section of a portion of the substrate 40 of the second substrate configuration after the hard mask 44 has been removed.

Figure 5:
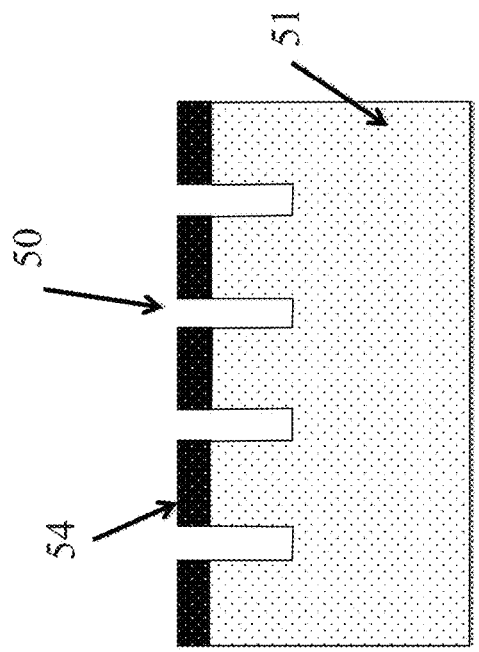
FIGS. 5A to 5D illustrate a third method to etch deep, high-aspect ratio features into a substrate according to the present invention.
Figure 5:
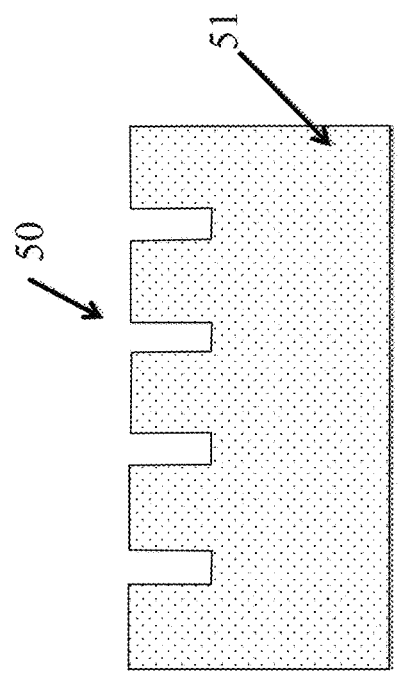
Figure 5:
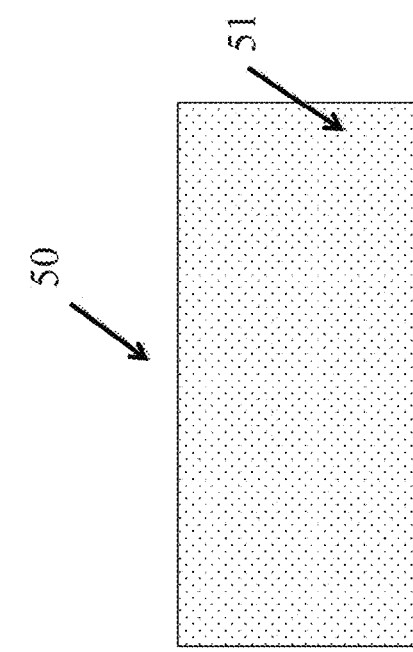
Figure 5:
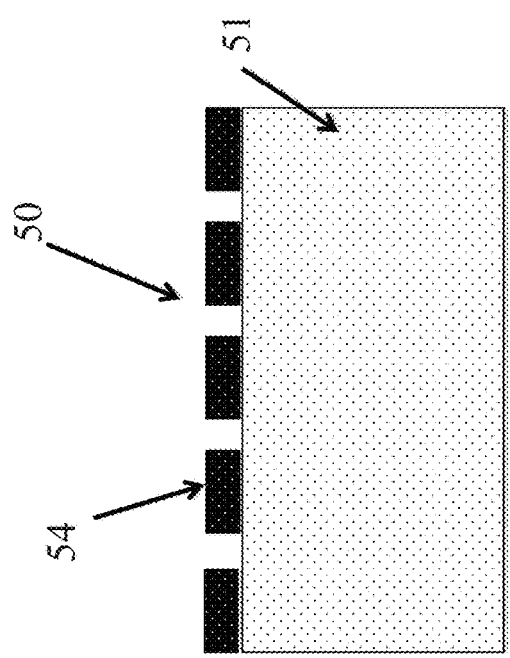

In FIG. 5A is shown a cross section of a portion of the substrate 50 of the third substrate configuration before performing the etch. The substrate 50 has a first material substrate 51 of a predetermined thickness. The first material substrate 51 is comprised of silicon dioxide and can be one of the material types, including: quartz; fused silica; fused quartz; glass; borosilicate glass (Pyrex®); or any material layer, the majority of which is comprised of silicon dioxide. The first material substrate 51 can have a complete crystal structure, a partial crystal structure, or be amorphous. Additionally, the first material substrate 51 can include additives or dopants of any type or amount.

The thickness of the first material substrate 51 can range from tens of microns to hundreds of microns, or even a few millimeters.

FIG. 5B illustrates a cross section of a portion of the substrate 50 of the third substrate configuration with a patterned third material layer 54 with a predetermined thickness on the surface of the first material substrate 51 prior to the etch in the first material substrate 51 having been performed. The patterned third material layer 54 functions as a etch mask during the etching of the first material substrate 51. FIG. 5C illustrates a cross section of a portion of the substrate 50 of the third substrate configuration after the etch of the silicon dioxide first material substrate 51 has been performed. In this illustration, the trench was etched into the first material substrate 51. It is noted that the etch in the first material substrate 51 can be performed through a portion of the first material substrate 51, or completely through the first material substrate 51, depending on the depths desired for any given device design and application. FIG. 5D illustrates a cross section of a portion of the substrate 50 of the third substrate configuration after the patterned third material layer 54 that functions as an etch mask has been removed.

There are several methods that can be used for making the etch mask on the surface of the silicon dioxide layer prior to the etch being performed in the material. It is important to note that the process to make the etch mask can be performed on any of the substrate configurations comprised of one or more material layers to form a substrate 30, 40 and 50 as described in FIGS. 3A to 3D, 4A to 4D and 5A to 5D.

In one method, the substrate has a thin adhesion layer deposited on the surface. This adhesion layer is usually required to get good adhesion between the subsequently deposited plating base layer and the substrate material layer, which is a form of silicon dioxide. This adhesion layer is usually comprised of titanium or chrome, but other metals can be used as well, and the thickness of the adhesion layer is typically 100 Angstroms to 500 Angstroms. This adhesion layer can be deposited using any technique of physical vapor deposition, including sputtering and evaporation.

Subsequently, a plating base material layer is deposited on the surface. The plating base is usually made of gold, but other electrically conductive materials can be used as well such as silver or copper. The thickness of this plating layer can range from below 50 nm to over 1.0 micron. This plating base layer can be deposited using any technique of physical vapor deposition including sputtering and evaporation and may be deposited in the same system as the adhesion layer was deposited without breaking vacuum. Subsequently, a suitable polymer material layer is deposited onto the surface of the wafer, which is then patterned into the desired dimensions and features of a plating mold. The polymer layer will typically be a photoresist material that can be directly patterned using photolithography. After a short exposure to an oxygen plasma to remove any organic contaminates on the surface of the plating base, the substrate is immersed into a electrochemical plating bath solution to electroplate a predetermined material layer onto the plating base where it is exposed in the polymer mold. The plating process is continued until a desired thickness of material has been plated and the ultimate thickness will depend on the material being used as a etch mask.

Subsequently, the substrate is removed from the plating bath and may have the surface of the plated metal polished to reduce the surface roughness. The polymer plating mold is then removed by immersing the substrate into an appropriate chemical solution. The plating base and adhesion layers are then removed in the locations where the plating base layer is exposed, that is, in those locations on the substrate surface where there is not any plated material layer on top of the plating base layer. The technique for removing the plating base and adhesion layers is by immersing the substrate into an appropriate chemical solution(s). Such chemical solution(s) are well known to those skilled in the art. Alternatively, ion milling can also be used to remove these layers.

An alternative method for making an etch mask on the surface of the substrate involves depositing an etch mask material onto the surface of the substrate. Subsequently, a layer of photoresist is deposited onto the surface of the deposited layer and patterned using photolithography, followed by etching. The exposed areas of the etch mask material layer are etched. Lastly, the photoresist is removed using either a solvent strip or a plasma ashing. The material layer deposited can be either a physical vapor deposition, as well as a substrate bonding depending on the thickness of material layer desired.

Importantly, the technique used to fabricate the hard mask will depend on the hard mask thickness required, which depends on the depth of the etch and the etch mask selectivity. The etch mask selectivity is the ratio of the etch rate of the material being etched and the etch rate of the mask material, or in equation form:

Etch mask selectivity=(material etch rate)/(etch mask etch rate).

It is also important to point out that the etch mask will have a pattern that is the reverse of the to-be etched features in the silicon dioxide layer or substrate.

Among the etch mask materials that are suitable using the method of the present invention are included various metals: nickel; silicon; titanium; tungsten; chrome; copper; brass; gold; silver; as well as a number of semiconductors: silicon, germanium, silicon carbide; and ceramic material layers including: alumina; tungsten carbide; chromium carbide; and others. Copper has been found to be particularly attractive as an etch mask, since it exhibits very high etch mask selectivity in this etch processes. Mask selectivity is defined as the ratio of the etch rate of the material being etched to the etch rate of the mask. A high mask selectivity ratio is ratio above 50 and a very high mask selectivity is a ratio above 100. The reason this is important is that a thinner layer of copper can be used to etch deep into silicon dioxide and a thinner layer of etch mask affords the capability for more precise dimensional control of the etch mask features as well as the etched features, which is a high-fidelity reverse representation of the etch mask. Specifically, a copper etch mask can have a thickness of less than one micron and still allow deep etches (>100 microns) into the silicon dioxide material being etched. Additionally, it should be noted that one or more etch mask materials layers may be used as well.

The etching process method of the present invention involves the optimal or near optimal adjustment of the independent process parameters that substantially effect the outcome of the etch process. For most MEMS, electronic, photonic, nanotechnology devices, the most important characteristics related to the most desired outcome of the etch on silicon dioxide are the depth of the etch, the aspect ratio, the verticality of the etched features sidewalls, hard mask selectivity to etch mask used, and cleanliness and defect level of the etched pattern. It is desired that the etch can achieve deeper etches into silicon dioxide, since this will provide increased flexibility for use of this etch process for different device designs compared to only being able to etch shallow features. It is also desired to have an etch process that has a high aspect ratio since this increases device density compared to sloping sidewalls. It also provides for increased process flexibility. Generally, for most device fabrications, a vertical sidewall, in which the sidewall is 90 degrees orthogonal to the top surface being etched, is most desired. It is also most desired that the mask selectivity is as high as possible, since this allows the use of thinner etch masks. Lastly, it is most desired to have few to no etch defects. The usual type of etch defect in this type of process is generally caused by micro-masking, in which a particulate that may be a result of the etching process lands on the surface of the material being etched and either terminates or slows down the etch process at that location, while the areas around this location continue to etch at the normal rate. This leads to point defects that protrude from the bottom of the etch trench upwards some distance toward the surface of the etched substrate.

It is noteworthy that the depth of the etch and aspect ratio will depend on the device design that is being fabricated. Therefore, there are tradeoffs with the etch process parameter settings in the desired outcomes. For example, a higher aspect ratio can be obtained with a shallower depth of etched features.

The technique used to determine the optimal process parameter settings is based on a Design of Experiments (DOE). In a DOE, selected process settings are varied in a pre-selected (open loop) fashion and important characteristics of the resulting etched structure are measured for each combination of process settings attempted. Each substrate etched with a specific set of process parameters settings represents a unique data point. Each substrate has extensive metrology performed on it after the etch to determine and quantify the outcome of each etch based on the specific etch process parameters and desired etch outcomes. The metrology performed in the DOE is described in more detail below.

A listing of all etch process parameters known to affect the etch outcome is shown in the table in FIG. 6. As can be seen, there are a total of fourteen (14) etch parameters.

The etching of silicon dioxide uses perflouropropane ($C_3F_8$) as a reactive gas for the plasma. The dissolution of the silicon dioxide occurs as a complex interaction between ions in the plasma and the solid silicon dioxide, in addition to removal of silicon dioxide, the process forms a complex fluorocarbon polymer on the substrate. Due to the directionality of the incoming ions, there is a preferential removal direction of the polymer, which leads to anisotropy in the etched feature shape.

It has been established that the addition of oxygen gas to the plasma affects the polymerization rate in the process, since oxygen ions chemically attack the polymer that is formed as part of the etching process. It is further established that the addition of argon gas to the plasma affects the polymerization rate in the process, since argon ions physically sputter away the polymer formed as part of the etching process by impingement. Therefore, changes in etch rate, mask selectivity, and anisotropy (verticality and shape of the sidewalls) can be realized by varying the flow rate of Oxygen (O2) or Argon (Ar) into the etch chamber.

The metrology data collection performed on the substrates during the performance of the DOE was based on a number of tools and techniques including: optical microscopy, scanning electron microscopy (SEM), and optical profilometry. Using these methods, a total of eighteen characteristic parameters (see FIG. 7) were derived for each substrate. The procedure to process and collect the metrology data from the DOE substrates was as follows:
1. Fabricate substrates of glass, fused silica or quartz having suitable patterned hard etch mask on the substrate surfaces;
2. Perform pre-etch inspection/data collection on the substrates;
3. Etch substrates using a predetermined etch process parameter setting selected as part of the DOE;
4. Collect post-etch metrology data on each substrate;
5. Clean substrate; and then,
6. Collect cross-section metrology data on substrates.

Figure 8:
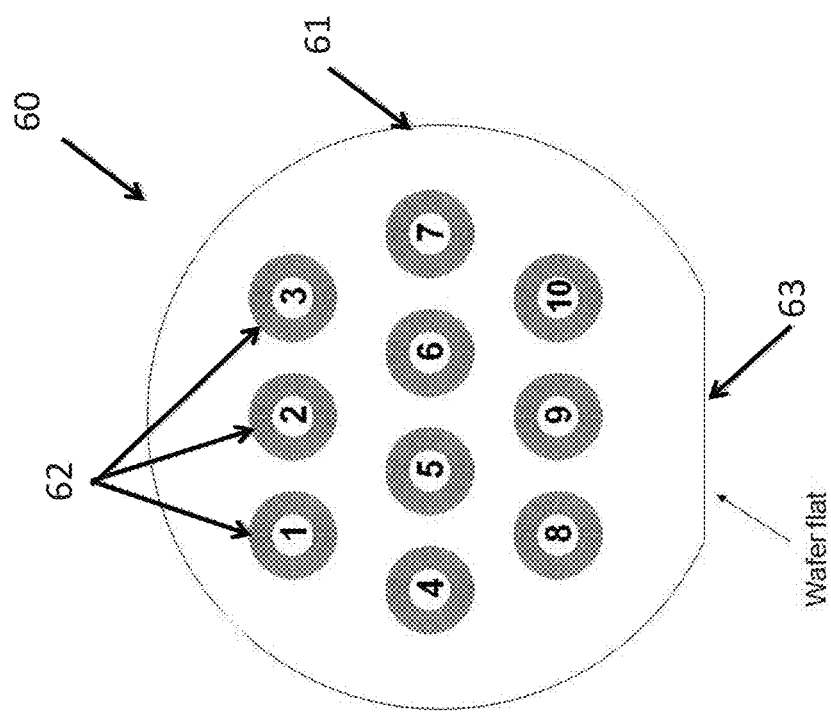
FIG. 8 is an illustration of the physical placement of etched structures on substrates used in the design-of-experiments (DOE) described herein.

For common reference, ten test devices per wafer were referenced, as illustrated in the plan view of a substrate 60 in FIG. 8. These ten devices 62 were spaced out over a 100 mm diameter substrate 61 with the wafer flat 63 at the bottom. In performance of the DOE, each of the individual process parameters are varied one at a time and the process outcomes are measured by taking metrology measurements on the substrates both before and after etching. The nominal depth of each etch performed in the DOE was over 100 microns. Once all data of the DOE has been collected, multiple regression analysis was used to analyze and map the data in order to determine the weighted optima etch process parameter settings by interpolation of the derived regression model.

Figure 9:
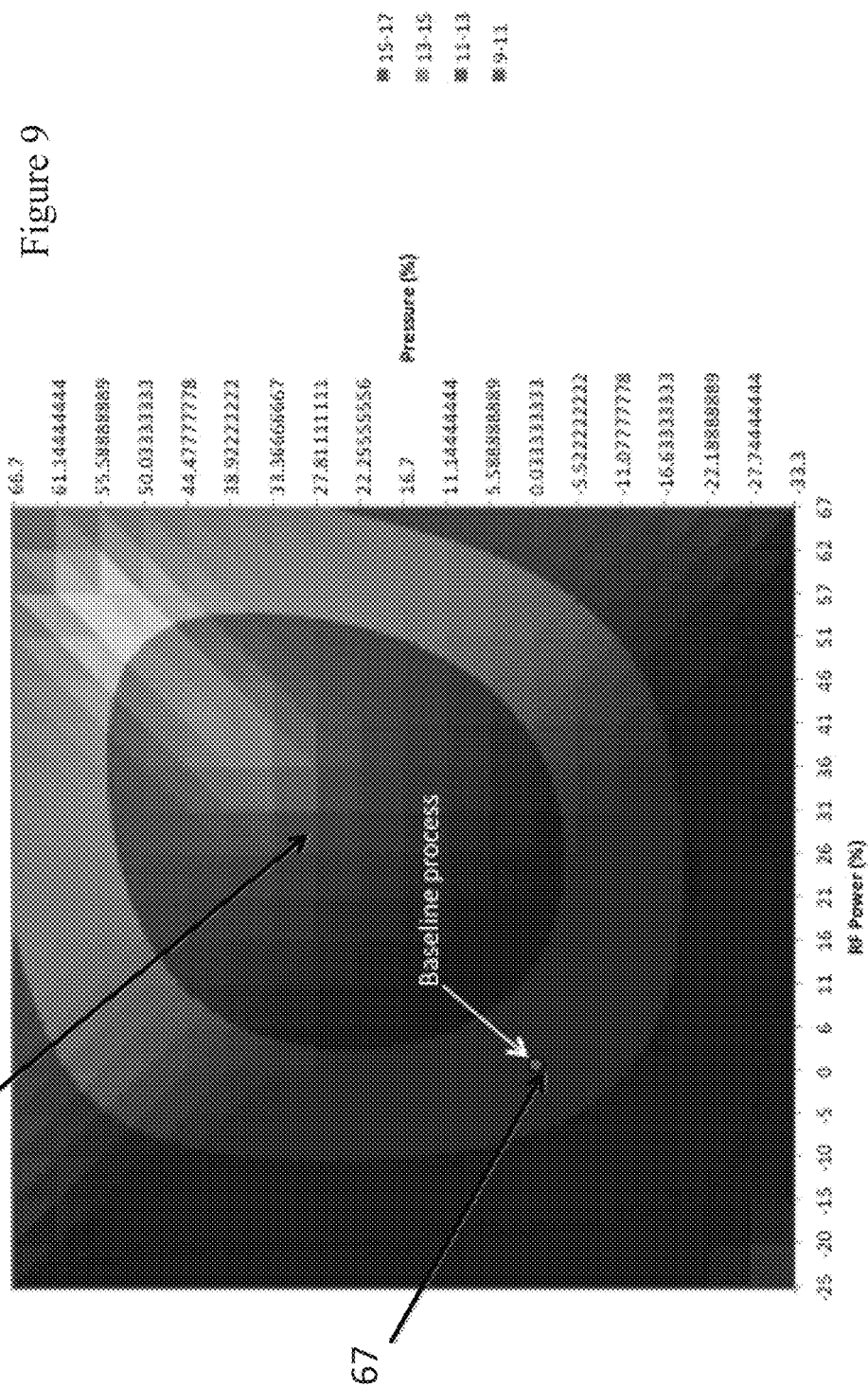
FIG. 9 is graphical representation of the relationship between etch mask selectivity and plasma RF bias voltage and chamber pressure derived from the DOE described herein.

Given the number of variables involved, a full graphical representation showing the global relationship and sensitivity between the input and output parameters is not possible. Nevertheless, an individual output parameter can be plotted against two process parameters to allow some visualization of the process space. An example of this plotting 65 is shown in FIG. 9, which plots the variation in mask selectivity against two input parameters, namely RF power and process chamber pressure, while the other input parameters are held to the value of a baseline recipe. These maps can be created for each scenario and allow a limited visualization of the process space. The baseline (or starting point) process 67 is also shown on this plot as a gray dot. As can be seen in FIG. 9, there is a definite optimal process space 66 for these input parameters for the mask selectivity, as shown by the circular middle region.

The definition of an optimal or near optimal etch process depends on the exact specifics of what is desired in the outcome of an etch process. Therefore, presented are variations on the recipe (method) for various process outcomes. In any case, the etch processes given below can be used to etch into silicon dioxide materials to depths of less than 1 micron to several millimeters and with aspect ratios ranging from less than "1 to 1", from an aspect ratio of between "1 to 1" to "10 to 1", and even aspect ratios to well over "10 to 1". It should be noted that the hard mask will need to be adjusted to be sufficiently thick so that it will be able to remain until the etch depth desired is obtained, as noted below.

The optimum or near optimum process recipe for the etching deep, high aspect ratio features into silicon dioxide is comprised of a Radio Frequency (RF) bias power on the substrate being etched of between 175 and 225 Watts, a substrate chuck temperature of between 5 and 20 degrees Celsius, an Oxygen (O2) gas flow rate of between 0 and 30 standard cubic centimeters per minute (sccm), an etch chamber gas pressure of between 1 and 15 milliTorr, a perflouropropane ($C_3F_8$) gas flow rate of between 10 and 60 standard cubic centimeters per minute (sccm), a Radio Frequency (RF) antenna power to create the plasma of between 1500 and 2500 Watts, a top magnet current of between 4 and 8 Amps, a center magnet current of 8 and 12 Amps, a bottom magnet current of between 4 and 8 Amps, a heat shield temperature of between 100 and 200 degrees-Celcius, and a Helium gas substrate cooling pressure of between 2 and 20 Pascals.

Typically, depending on the depth of the etch and the time spent etching, a cleaning cycle may be performed between etch cycles. During the cleaning cycle, the flow rate of etch gas perflouropropane ($C_3F_8$) is reduced to 0 standard cubic centimeters per minute (sccm), and the flow rate of Oxygen (O2) gas is continued into the etch chamber with a plasma in order to perform a cleaning of the etch chamber. The Oxygen (O2) plasma removes the polymer buildup that is a byproduct of the etch process from the etch chamber walls.

Although any etch cycle time and cleaning time can be used effectively for the etch method of the present invention, an etch cycle time of between 10 and 120 minutes, and an Oxygen (O2) clean cycle time of between 30 seconds and 10 minutes that is performed in between each etch cycle, would be one example of suitable times.

It is important to note that there is a range of values for each process parameter. There are several reasons for this. First, each etch tool will have slightly different values of each process parameter in order to have optimal etch result based on slight differences in the tool design and performance. Second, the thermal characteristics, specifically the thermal resistance from the surface of the substrate to the backside of the substrate where the active Helium cooling is used to control the temperature of the substrate, will vary from substrate to substrate, depending on the exact thickness of the substrate and layers on the substrate, and this has a slight impact on the etch outcome. Therefore, the etch recipe will be slightly adjusted to compensate for differences in the substrate configuration and thickness of the material layers.

The above process method is suitable for etching deep, high aspect ratio features into silicon dioxide. However, in order to obtain a maximum rate of etch into silicon, the following process parameters are preferred:

RF Bias Power: 190 to 210 Watts
Substrate temperature: 14 to 16 C
O2 gas flow: 14 to 16 sccm
Chamber pressure: 4 to 6 milliTorr
C3F8 gas flow: 28 to 32 sccm
RF antenna power: 1900 to 2000 Watts
Top magnet current: 5.9 to 6.3 Amps
Center magnet current: 10.0 to 10.2 Amps
Bottom magnet current: 5.9 to 6.3 Amps
Heat shield temperature: 140 to 160 C
He cooling pressure: 3 to 7 Pascals Although any etch cycle time and cleaning time can be used effectively for the etch method of the present invention, an etch cycle time of between 20 and 40 minutes, and an Oxygen (O2) clean cycle time of between 30 seconds and 5 minutes that is performed in between each etch cycle, would be one example of suitable times.

Using the above process parameter settings will result in an average etch rate of approximately 581 nm/min for an etch of over 125 microns in depth. It is important to point out that the etch rate decreases as the depth of the etch (and aspect ratio) increases, and therefore the above maximum etch rate will depend on the depth of the etch, as well as the aspect ratio.

In order to obtain the maximum hard mask selectivity in the etch process of the present invention, the following process parameters are used:
RF Bias Power: 190 to 210 Watts
Substrate temperature: 7 to 11 C
O2 flow: 0 sccm
Chamber pressure: 4 to 6 mTorr
C3F8 gas flow: 28 to 32 sccm
RF antenna power: 1900 to 2000 Watts
Top magnet current: 5.9 to 6.3 Amps
Center magnet current: 10.0 to 10.2 Amps
Bottom magnet current: 5.9 to 6.3 Amps
Heat shield temperature: 140 to 160 C
He cooling pressure: 3 to 7 Pascals Although any etch cycle time and cleaning time can be used effectively for the etch method of the present invention, an etch cycle time of between 20 and 40 minutes, and an Oxygen (O2) clean cycle time of between 30 seconds and 5 minutes that is performed in between each etch cycle, would be one example of suitable times. Using the above process parameter settings will result in mask selectivity of 14.8.

To obtain the maximum mask selectivity and vertical or nearly vertical sidewalls (90 deg+/−0.5 deg), the following process parameters are used:
RF Bias Power: 106 to 126 Watts
Substrate temperature: 14 to 16 C
O2 gas flow: 14 to 16 sccm
Chamber pressure: 4 to 6 mTorr
C3F8 gas flow: 28 to 32 sccm
RF antenna power: 1900 to 2000 Watts
Top magnet current: 5.9 to 6.3 Amps
Center magnet current: 10.0 to 10.2 Amps
Bottom magnet current: 5.9 to 6.3 Amps
Heat shield temperature: 140 to 160 C
He cooling pressure: 3 to 7 Pascals Although any etch cycle time and cleaning time can be used effectively for the etch method of the present invention, an etch cycle time of between 20 and 40 minutes, and an Oxygen (O2) clean cycle time of between 30 seconds and 5 minutes that is performed in between each etch cycle, would be one example of suitable times. Using the above process parameter settings will result in mask selectivity of 13.7 and etched feature sidewalls having an angle of 90 deg+/−0.5 deg.

To obtain the highest etch rate and vertical or nearly vertical sidewalls (90 deg+/−0.5 deg), the following process parameters are used:
RF Bias Power: 190 to 210 Watts
Substrate temperature: 14 to 16 C
O2 gas flow: 8 to 10 sccm
Chamber pressure: 4 to 6 mTorr
C3F8 gas flow: 28 to 32 sccm
RF antenna power: 1900 to 2000 Watts
Top magnet current: 5.9 to 6.3 Amps
Center magnet current: 10.0 to 10.2 Amps
Bottom magnet current: 5.9 to 6.3 Amps
Heat shield temperature: 140 to 160 C
He cooling pressure: 3 to 7 Pascals Although any etch cycle time and cleaning time can be used effectively for the etch method of the present invention, an etch cycle time of between 20 and 40 minutes, and an Oxygen (O2) clean cycle time of between 30 seconds and 5 minutes that is performed in between each etch cycle, would be one example of suitable times. Using the above process parameter settings will result in etch rate of 571 nm/min and etched feature sidewalls having an angle of 90 deg+/−0.5 deg.

The process of etching of the present invention can be used to etch features partly into the silicon dioxide material layer or substrate, as well as completely through the silicon dioxide material layer or substrate, depending on the etch depth desired and the device or structure design. It should be noted that all of the recipes include process parameters that are given as a range of values. One reason for this is that there will be slight differences in tool settings from tool to tool. Secondly, there may be slight differences based on the exact substrate configuration used, including the exact type of materials used in the substrate layers an the thickness that will impact the exact process settings in order to obtain the optimal or near optimal outcome.

Additionally, depending the exact situation there may be additional requirements that must be met in order to obtain an optimal or near optimal result with the etch process of silicon dioxide of the present invention. First, depending on the depth of the etch and the type of etch mask used, it may be desirable to use the minimal amount of etch mask material across the substrate surface, particularly if the etch mask is made from nickel. The reason is that if larger areas of the surface are covered by the etch mask, it increases the risk of particulates which can result in etch defects in the etched areas of the substrate. In shallow etches with depths of only a few microns, no more than 99% of the substrate surface should be covered in an etch mask. For slightly deeper etches in the order of 10 microns, no more than 75% of the substrate surface should be covered in an etch mask. For still deeper etches in excess of 25 microns, no more than 50% of the substrate surface should be covered in an etch mask. And, for still deeper etches in excess of 50 microns, no more than 25% of the substrate surface should be covered in an etch mask. For even deeper etches up to 100 microns, no more than 5% of the substrate surface should be covered in an etch mask. For very deep etches in excess of 100 microns, it may be desirable that less than 5% of the substrate surface should be covered in an etch mask.

Second, if uniform trench etch depths are desired, the etched features should have the same nominal dimension across the wafer. This is illustrated in FIGS. 10A and 10B, in which two substrates having different dimensions 70 in the etch mask are shown in FIGS. 10A and B. The In FIG. 10A, which is a plan view of a substrate 71, a etch mask 72 covers most of the substrate 71, except for the features in the etch mask given by the rectangles 73, 74 and 75, where the silicon dioxide would be exposed and can be etched. The etch rate depends on the size of the exposed areas on the substrate. That is, if the mask width is larger, the etch rate will be higher and conversely, if the masking width is smaller, the etch rate will be lower. Consequently, if there are features having different sized widths, the etch rate will vary, and by consequence, so will the depths of the etch features. Therefore, using the etch of the present invention, in performing an etch of the present invention on substrate 71, the depth of feature 75 would have the highest etch rate, and for a given etch time, would have the deepest trench, whereas feature 74 would have a less deep etch for the same etch time, and feature 73 would have the shallowest etch for the same etch time. In comparison, substrate 76 with an etch mask 77 has three features, given by 78, 79 and 80 all having the same feature widths. For a given etch time, the features 78, 79 and 80 will all have approximately the same depth of the trenches, Therefore, in order to have uniform trenches depths, the widths of the features should be approximately equal across a substrate.

Third, the etch chamber should be cleaned on a periodic basis between etches. For long etches, the chamber may need to be cleaned after each sample has been etched. This will reduce the amount of particulates in the etch chamber, and thereby, reduce the probability of etch defects. After an etch has been completed, the etch chamber walls are coated with a complicated polymer/hard mask material compound as a by-product of the etch process that can flake off from the chamber walls and land onto the substrate surface. The cleaning process involves a combination of oxygen plasma cleans and mechanical scrubbing of the chamber liner walls with an abrasive pad. Wiping the walls of the etch chamber with a solvent may also be advised in the cleaning procedure. A suitable solvent for the wiping of the chamber walls is isopropyl alcohol.

Figure 11:
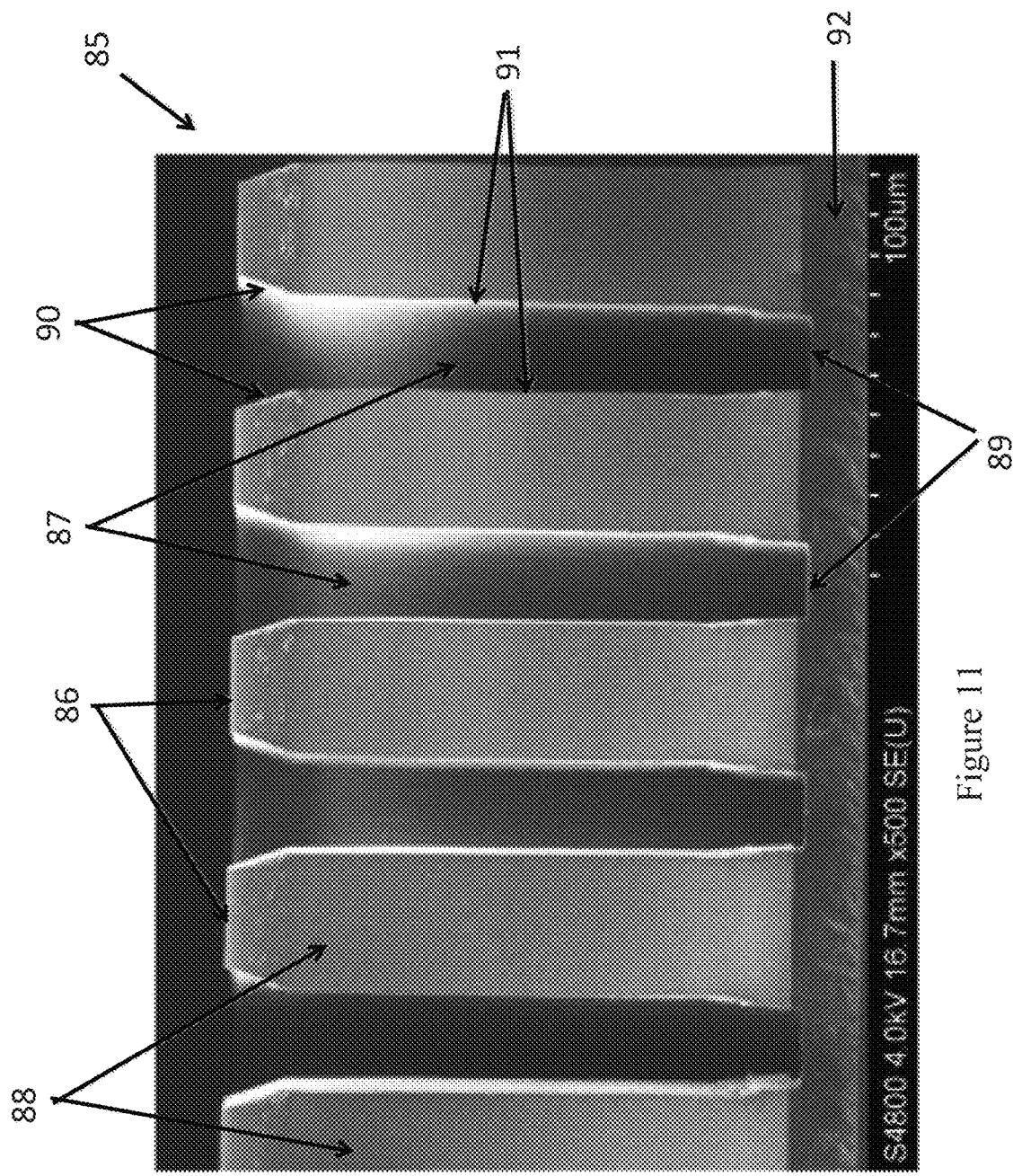
FIG. 11 is a scanning electron microscopy (SEM) image illustrating the presence of faceting near the top of the un-etched features as described herein.

Fourth, for a given mask selectivity and depth of etched features, the hard mask must be sufficiently thick so as to reduce or eliminate faceting of the sidewalls of the etched silicon dioxide material. FIG. 11 is a Scanning Electron Microscope (SEM) image 85 that shows an example of faceting 90 at the top sidewalls 91 of some etched trenches 87 into a fused silica material layer on top of a silicon layer 92 of thickness of approximately 30 microns that is on top of a fused silica layer (not shown in image) that is approximately 500 microns in thickness. The etched trenches 87 have a width of approximately 25 microns and the bottoms of the trenches 89 have a depth of approximately 125 microns and were etched using the method of the present invention. The unetched portion of the fused silica 88 on either side of the trenches 87 have tops 86 which is the surface of the fused silica substrate where the etch mask was located, but was removed prior to this image being taken. As can be seen in the top portion of the sidewalls 91, there is a sloping sidewall 90 and this is termed "faceting."

Figure 12:
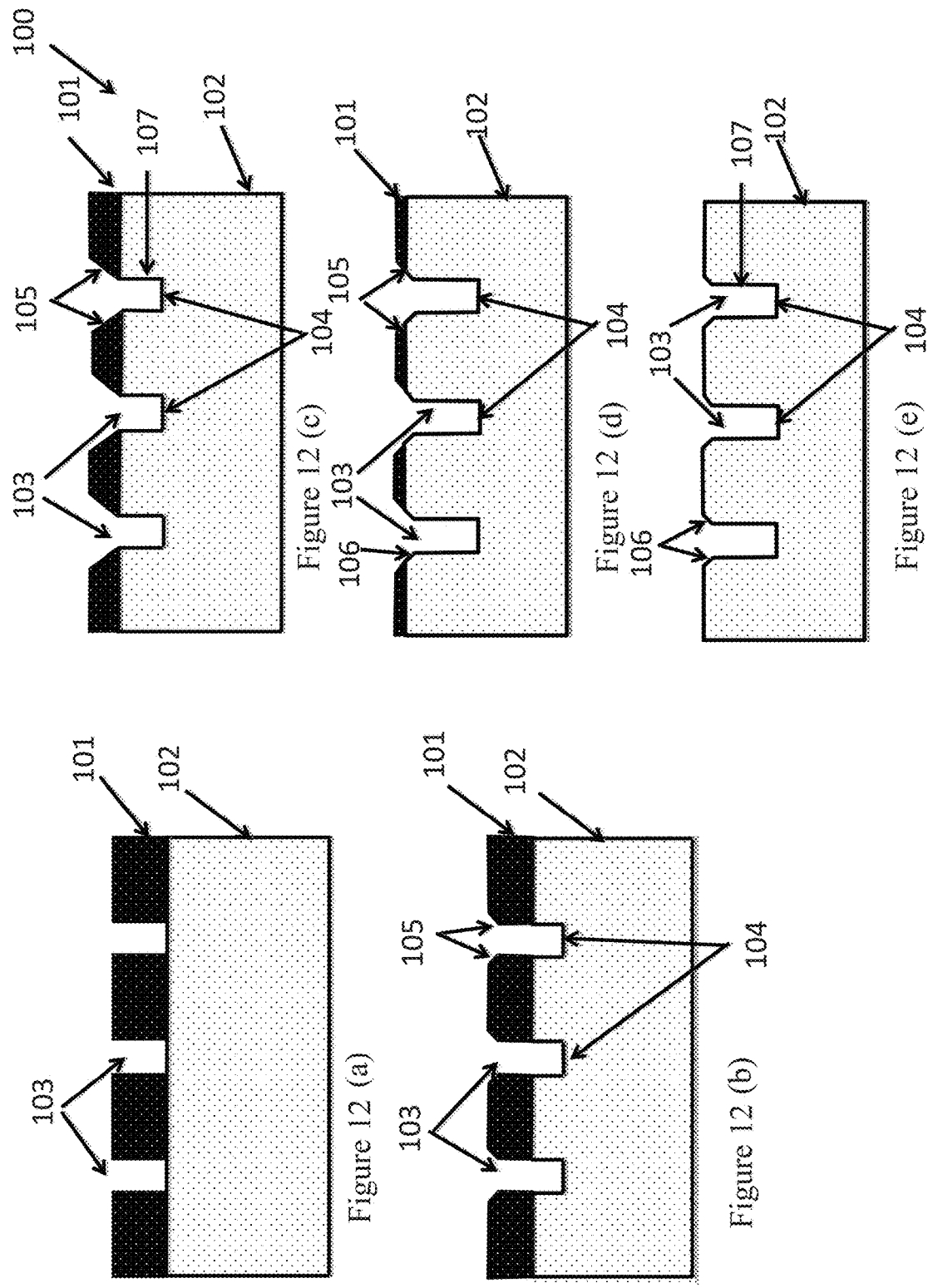
FIGS. 12A to 12e illustrate the mechanism involved in the formation of facets of the un-etched features as described herein.

Experimentation has shown that the amount of faceting of the etched silicon dioxide material is directly related to the erosion of the hard mask. FIGS. 12A to 12e are an illustration that explains this phenomenon by showing a series of cross sections 100 of a substrate of silicon dioxide 102 with a patterned etch mask 101 on the surface of the silicon dioxide substrate 102 with exposed areas 103 in the etch mask 101. These series of cross sections 100 of the substrate 102 are at different points in time as the etch in the substrate 102 is performed. FIG. 12A shows the substrate 102 before the etch has begun. On the surface of the substrate 102 there is a patterned etch mask 101 on a silicon dioxide substrate 102 with openings 103 exposing the substrate surface 102 and where the substrate 102 can be etched. As the etching begins, as shown in FIG. 12B, an approximately 45-degree slant or slope 105 is created at the edge of the hard mask open features 101. This is a result of the etch mask 101 distorting the electrical field lines impinging on the etch mask 101 on the substrate surface 102, thereby effectively causing increased ion bombardment onto the exposed etch mask 101 corners that erodes the corners 105 faster than the areas surrounding the etch mask 101. This approximately 45-degree taper 105 continues to grow as the etch proceeds and the trench 104 features gets deeper. As illustrated in FIG. 12C, eventually the 45-degree taper 105 intersects with the sidewalls 107 of the etched feature 103 in the silicon dioxide substrate 102. As the 45-degree taper 105 continues beyond the edge of the open trench 103 and into the silicon dioxide, it begins to propagate into the top edge of the silicon dioxide trench 106, as shown in FIG. 12D. Once the etch has been completed and the etch mask 101 has been removed, the faceting 106 that has been made at the top of the sidewalls 107 of the trenches 103 made in the silicon dioxide substrate 102 are now permanent as shown in FIG. 12E.

Importantly, if the thickness of the etch mask 101 is sufficiently thick or the mask selectively is sufficiently high, then the edge of the 45-degree taper 105 does not reach the top edge of the trench 103 during the etch time and no top-hat facet 106 will be formed at the top of the sidewalls 107.

The calculation for the etch mask 101 thickness required to avoid the formation of the faceting 106 is as follows. If it is assumed a near vertical etch mask 101 sidewall is started with and that the facet angle 106 formed in the etch mask 101 material is 45 degrees, which is what is experimentally observed, the etch mask 101 thickness required to prevent the facet (top hat) 106 from forming in the etched features 103 in the silicon dioxide substrate 102 is simply two times the etch mask 101 thickness removed during the etch. So, if, for instance, it is desired to etch features 104 having a depth of 100 microns into silicon dioxide substrate 102, in which the mask selectivity is 20:1, it can be calculated that the etch mask 101 must be at least 5 microns in thickness to have any etch mask 101 remaining at the end of the etch to this depth 104 and the thickness of the etch mask 101 must be at least 10 microns to avoid the faceting 106, or:

Thickness of Etch Mask>2*(Etch Depth/Mask Selectivity).

Figure 13:
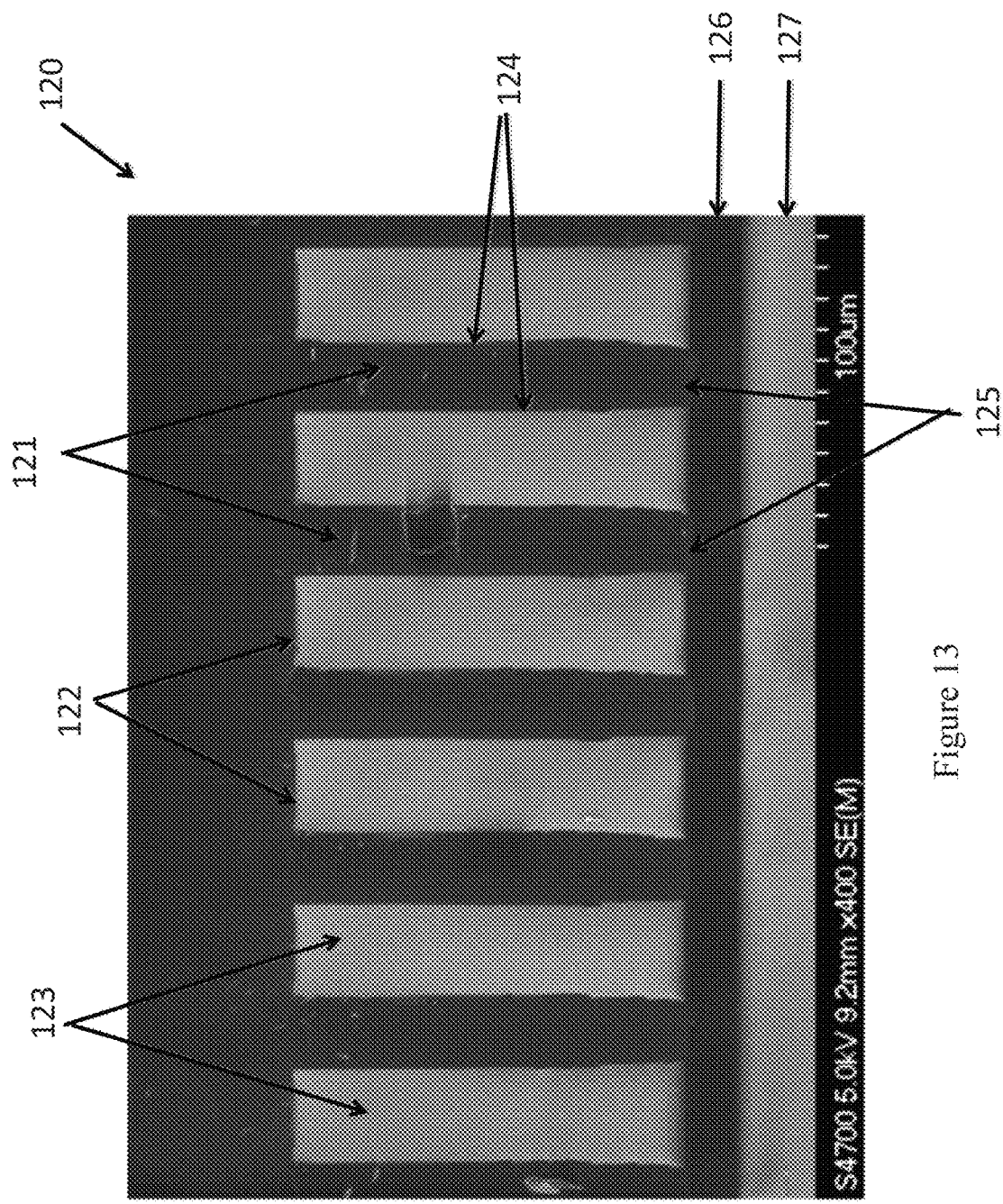
FIG. 13 is a scanning electron microscopy (SEM) image illustrating the absence of faceting near the top of the un-etched features, according to the present invention.

FIG. 13 is a Scanning Electron Microscope (SEM) image 120 showing etched trenches 121 into a layer of fused silica to form vertical features 123 of fused silica. The depth of the etch is 125 and terminates on a layer of silicon 126 that has a thickness of approximately 30 microns, and this layer of silicon 126 is on top of a fused silica substrate 127 that has a thickness of approximately 500 microns. The top of the unetched portion of the fused silica 122 is where an etch mask was located that was removed prior to this image 120 being taken. The sidewalls 124 of the etched trenches 121 show no sign of a faceting since the etch mask thickness was sufficient to prevent the 45-degree sidewall in the etch mask from reaching the edge of the sidewalls 124 according to the equation given above.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of making deep, high-aspect ratio features into a layer formed from a first material comprised of silicon dioxide, the method comprising:
   selecting a substrate formed from a second material of a predetermined thickness;
   fabricating the first material layer of a predetermined thickness on top of the second material substrate;
   fabricating a layer formed from a third material of a predetermined thickness on the surface of the first material layer, the third material layer functioning as hard etch mask layer and having a pre-determined inverse pattern of features to be etched into the first material layer, the third material layer being comprised of a ceramic, semiconductor or metal material; and
   performing, without the presence of a hydrogen containing process gas, a deep, high-aspect ratio Inductively-Coupled Plasma (ICP) etch into the exposed regions of the first material layer to a predetermined depth of at least 2 microns using an ICP etch system configured with an electromagnetic neutral loop comprised of at least three (3) magnetic coils to provide a uniform etch of the first material layer across the substrate surface, wherein the material type and predetermined thickness of the third material layer hard etch mask allow the third material layer to persist until the predetermined etch depth into the first material layer is obtained.

2. The method of claim 1, wherein the first material layer is comprised of silicon dioxide having a thickness of between 2 microns and several millimeters and can be one or more material types selected from group consisting of fused silica; glass; quartz; fused quartz; borosilicate glass; and any material type, the majority of which is comprised of silicon dioxide.

3. The method of claim 1, wherein the first material layer comprised of silicon dioxide that is completely a crystal, is partially a crystal structure, or is amorphous.

4. The method of claim 1, wherein the first material layer is comprised of silicon dioxide material having any type or amount of additives incorporated in the silicon dioxide material.

5. The method of claim 1, wherein the Inductively-Coupled Plasma (ICP) etch system is comprised of a Radio Frequency (RF) antenna operating at a frequency of 13.56 MHz that creates an electromagnetic field within a process chamber where the etching of the first material is performed.

6. The method of claim 1, wherein the Inductively-Coupled Plasma (ICP) etch system is comprised of a separate Radio Frequency (RF) electromagnetic field applied to a chuck on which the second material substrate having the first material layer on top of the second material substrate is positioned during etching of the first material layer to obtain a high level of etch anisotropy in the first material layer.

7. The method of claim 6, wherein the separate Radio Frequency (RF) electromagnetic field applied to the chuck has a frequency of 13.56 MHz.

8. The method of claim 1, wherein the Inductively-Coupled Plasma (ICP) etcher is comprised of an electromagnetic neutral loop, which is comprised of magnetic coils and which enables spatial redistribution of ions in a plasma to enhance etching uniformity of the first material layer.

9. The method of claim 1, wherein the etch process uses perflouropropane ($C_3F_8$) as a reactive gas for a plasma that is used to etch the first material layer.

10. The method of claim 9, wherein the etch process occurs as a complex interaction between ions in the plasma and the first material layer to form a complex fluorocarbon polymer on the exposed first material layer, and wherein due to the directionality of the incoming ions, a preferential removal direction of the polymer occurs, thereby leading to a high level of anisotropy in the etched feature shapes in the exposed first material layer.

11. The method of claim 1, wherein oxygen gas is added to the plasma to modify the etch rate, mask selectivity, and anisotropy of the etched features in the first material layer, and wherein anisotropy is verticality and shape of the sidewalls.

12. The method of claim 1, wherein the depth of the etch in the first material layer is between 2 microns and 1 millimeter.

13. The method of claim 1, wherein the depth of the etch in the first material layer is more than 1 millimeter.

14. The method of claim 1, wherein the etch features in the first material layer have an aspect ratio of between 1 to 1 and 10 to 1.

15. The method of claim 1, wherein the etch in the first material layer has an aspect ratio of less than 1 to 1.

16. The method of claim 1, wherein the etch in the first material layer has an aspect ratio of more than 10 to 1.

17. The method of claim 1, wherein the third material layer is comprised of one or more metals selected from a group consisting of nickel, gold, brass, copper, silver, titanium, tungsten and chrome.

18. The method of claim 17, wherein the third material layer is comprised of copper and has an negligible etch rate.

19. The method of claim 18, wherein the third material layer comprised of copper has a large ratio of the etch rate of the first material layer to the etch rate of copper.

20. The method of claim 17, wherein the third material layer is deposited onto the first material layer using electrochemical plating or physical vapor deposition.

21. The method of claim 17, wherein the third material layer is patterned into a reverse image of features to be etched on the first material layer by performing photolithography and etching on the third material layer.

22. The method of claim 21, wherein a polymer layer is patterned into an image of features to be etched on the first material layer by performing photolithography, and the third material layer is deposited in a polymer mold using electrochemical plating and then the polymer mold is removed leaving the third material layer patterned.

23. The method of claim 1, wherein the third material layer is made of one or more semiconductor materials selected from a group consisting of silicon, germanium and silicon carbide.

24. The method of claim 23, wherein the third material layer is bonded to the first material layer and then patterned and etched into a predetermined reverse pattern of features to be etched into the first material layer.

25. The method of clam 23, wherein the third material layer is deposited onto the first material layer and then patterned and etched into a predetermined reverse pattern of features to be etched in the first material layer.

26. The method of claim 1, wherein the third material layer is made of one or more ceramic materials selected from the group consisting of alumina; tungsten carbide; and chromium carbide.

27. The method of claim 26, wherein the third material layer is bonded to the first material layer and then patterned and etched into the desired reverse pattern of the desired etched features in the first material layer.

28. The method of clam 26, wherein the third material layer is deposited onto the first material layer and then patterned and etched into a predetermined reverse pattern of features to be etched into the first material layer.

29. The method of claim 1, wherein the second material substrate is comprised of a metal, semiconductor, silicon dioxide, or ceramic material layer.

30. The method of claim 29, wherein the second material substrate is comprised of one or more silicon dioxide materials selected from the group consisting of fused silica, glass, quartz, fused quartz, borosilicate glass, and any material type, the majority of which is comprised of silicon dioxide.

31. The method of claim 29, wherein the second material substrate is comprised of one or more ceramics selected from the group consisting of aluminum oxide, alumina, titanium nitride, tungsten carbide; chromium carbide; and any known ceramic material in either single crystal or polycrystalline form.

32. The method of claim 29, wherein the second material substrate is made of one or more semiconductor materials selected from the group consisting of silicon, germanium, silicon carbide, gallium arsenide; gallium nitride; lithium niobate; and any known semiconductor material in either single crystal or polycrystalline form.

33. The method of claim 29, wherein the second material substrate is made of one or more metals selected from the group consisting of copper, stainless steel, nickel, tungsten, brass, chrome; or titanium, and a combination of such metals that have been laminated or alloyed together, either in single crystal or polycrystalline form.

34. The method of claim 1, wherein an etch recipe is used for etching the first material layer, the etch recipe comprising a Radio Frequency (RF) bias power of between 175 and 225 Watts, a chuck temperature of between 5 and 20 degrees Celsius, an Oxygen (O2) gas flow rate of between 0 and 30 standard cubic centimeters per minute (sccm), an etch chamber gas pressure of between 1 and 15 milliTorr, a perflouropropane ($C_3F_8$) gas flow rate of between 10 and 60 standard cubic centimeters per minute (sccm), a Radio Frequency (RF) antenna power to create a plasma of between 1500 and 2500 Watts, a top magnet current of between 4 and 8 Amps, a center magnet current of 8 and 12 Amps, a bottom magnet current of between 4 and 8 Amps, a heat shield temperature of between 100 and 200 degrees-Celsius, and a Helium gas substrate cooling pressure of between 2 and 20 Pascals.

35. The method of claim 34, wherein the etch recipe of the first material layer is further comprised of an etch cycle time of between 15 and 60 minutes, and an Oxygen (O2) clean cycle time of between 30 seconds and 10 minutes.

36. The method of claim 34, wherein the etch recipe, to achieve the maximum etch rate in the first material layer, is comprised of a Radio Frequency (RF) bias power of between 190 and 210 Watts, a chuck temperature of between 14 and 16 degrees Celsius, an Oxygen (O2) gas flow rate of between 14 and 16 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.4 Amps, a bottom magnet current of between 5.9 and 6.3 Amps, a heat shield temperature of between 140 and 160 degrees-Celsius, and a Helium gas substrate cooling pressure of between 3 and 7 Pascals.

37. The method of claim 36, wherein the etch recipe for etching the first material layer is further comprised of an etch cycle time of between 15 and 60 minutes, and an Oxygen (O2) clean cycle time of between 30 seconds and 10 minutes.

38. The method of claim 34, wherein the etch recipe for etching the first material layer to achieve a maximum mask selectivity is comprised of a Radio Frequency (RF) bias power on the substrate being etched of between 190 and 210 Watts, a substrate temperature of between 7 and 11 degrees Celsius, an Oxygen (O2) gas flow rate of between 0 and 5 standard cubic centimeters per minute (sccm), an etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

39. The method of claim 38, wherein the etch recipe for etching the first material layer is further comprised of an etch cycle time of between 15 and 60 minutes, and an Oxygen (O2) clean cycle time of between 30 seconds and 10 minutes.

40. The method of claim 34, wherein the etch recipe for etching the first material layer to achieve a maximum etch rate and vertical, or near vertical etch feature sidewalls is comprised of a Radio Frequency (RF) bias power on the substrate being etched of between 190 and 210 Watts, a substrate temperature of between 14 and 16 degrees Celsius, an Oxygen (O2) gas flow rate of between 8 and 10 standard cubic centimeters per minute (sccm), an etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

41. The method of claim 40, wherein the etch recipe for etching the first material layer is further comprised of an etch cycle time of between 15 and 60 minutes, and an Oxygen (O2) clean cycle time of between 30 seconds and 10 minutes.

42. The method of claim 34, wherein the etch recipe for etching the first material layer to achieve a maximum mask selectivity and vertical or near vertical etch feature sidewalls is comprised of a Radio Frequency (RF) bias power on the substrate being etched of between 106 and 126 Watts, a substrate temperature of between 14 and 16 degrees Celsius, an Oxygen (O2) gas flow rate of between 14 and 15 standard cubic centimeters per minute (sccm), an etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3

Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

43. The method of claim 42, wherein the etch recipe for etching the first material layer is further comprised of an etch cycle time of between 15 and 60 minutes, and an Oxygen (O2) clean cycle time of between 30 seconds and 10 minutes.

44. The method of claim 1, wherein the third material layer on the first material layer, when functioning as the etch mask, does not cover more than 99% of the first material layer surface.

45. The method of claim 1, wherein the third material layer on the first material layer, when functioning as the etch mask, does not cover more than 75% of the first material layer surface.

46. The method of claim 1, wherein the third material layer on the first material layer, when functioning as the etch mask, does not cover more than 50% of the first material layer surface.

47. The method of claim 1, wherein the third material layer on the first material layer, when functioning as the etch mask, does not cover more than 25% of the first material layer surface.

48. The method of claim 1, wherein the third material layer on the first material layer, when functioning as the etch mask, does not cover more than 5% of the first material layer surface.

49. The method of claim 1, wherein the third material layer on the first material layer, when functioning as the etch mask, covers 5% or less of the first material layer surface.

50. The method of claim 1, wherein dimensions of openings in the third material layer on the first material layer, where the third material layer functions as the etch mask, have identical or nearly identical widths across the substrate.

51. The method of claim 1, wherein the walls inside the etch chamber are periodically cleaned.

52. The method of claim 1, wherein the walls inside the etch chamber are mechanically scrubbed with an abrasive pad, wiped down with a solvent, and have an oxygen plasma clean performed between every substrate etch.

53. The method of claim 1, wherein the walls inside the etch chamber are mechanically scrubbed with an abrasive pad, wiped down with a solvent, and have an oxygen plasma clean performed between every five substrate etches.

54. The method of claim 1, wherein the third material layer that is used as the etch mask has a thickness of at least a value determined by dividing etched feature depth by etch mask selectivity and multiplying by two, to thereby avoid faceting in the first material layer being etched.

55. The method of claim 1, wherein the third material layer is removed after an etch in the first material layer to a predetermined depth has been obtained.

56. The method of claim 1, wherein the depth of the etch performed into the first material layer completely goes through the predetermined thickness of the first material layer.

57. The method claim 56, wherein the first material layer is removed from the second substrate material after an etch to a predetermined depth has been performed.

58. A method of making deep, high-aspect ratio features in a layer formed from a first material comprised of silicon dioxide, the method comprising:
selecting a substrate layer formed from a second material of a predetermined thickness;
fabricating a layer formed from a fourth material of a predetermined thickness on top of the second material substrate;
fabricating the first material layer to a predetermined thickness on top of the fourth material layer;
fabricating a layer formed from a third material on a surface of the first material layer of the predetermined thickness, the third material layer functioning as hard etch mask layer and having a predetermined inverse pattern of features to be etched into the first material layer, the third material layer being comprised of a ceramic, semiconductor or metal material; and
performing, without the presence of a hydrogen containing process gas, a deep, high-aspect ratio Inductively-Coupled Plasma (ICP) etch into the exposed regions of the first material layer to a predetermined depth of at least 2 microns using an ICP etch system configured with an electromagnetic neutral loop comprised of at least three (3) magnetic coils comprised of at least three (3) magnetic coils to provide a uniform etch of the first material layer across the substrate surface,
wherein the material-type and predetermined thickness of the third material layer hard etch mask allow the third material layer to persist until the predetermined etch depth into the first material layer is obtained.

59. The method of claim 58, wherein the first material layer is comprised of silicon dioxide having a thickness of between 2 microns and several millimeters an comprised of one or more material types selected from a group consisting of fused silica; glass; quartz; fused quartz; borosilicate glass; and any material type, the majority of which is comprised of silicon dioxide.

60. The method of claim 58, wherein the first material layer comprised of silicon dioxide is completely a crystal, partially a crystal structure, or is amorphous.

61. The method of claim 58, wherein the first material layer is comprised of silicon dioxide material having any type or amount of additives incorporated in the silicon dioxide material.

62. The method of claim 58, wherein the Inductively-Coupled Plasma (ICP) etch system is comprised of a Radio Frequency (RF) antenna operating at a frequency of 13.56 MHz that creates an electromagnetic field within a process chamber where the etching of the first material is performed.

63. The method of claim 58, wherein the Inductively-Coupled Plasma (ICP) etch system is comprised of a separate Radio Frequency (RF) electromagnetic field applied to the chuck onto which substrate is positioned during etching to obtain a high level of etch anisotropy in the first material layer.

64. The method of claim 58, wherein the separate Radio Frequency (RF) electromagnetic field applied to the chuck has a frequency of 13.56 MHz.

65. The method of claim 58, wherein the Inductively-Coupled Plasma (ICP) etcher is comprised of an electromagnetic neutral loop, which is comprised of magnetic coils, and which enables spatial redistribution of ions in the plasma to enhance etching uniformity of the first material layer.

66. The method of claim 58, wherein the etch process uses perflouropropane ($C_3F_8$) as a reactive gas for the plasma that is used to etch the first material layer.

67. The method of claim 66, wherein the etch process occurs as a complex interaction between ions in the plasma and the first material layer to form a complex fluorocarbon polymer on the exposed first material layer, wherein due to a directionality of the incoming ions, a preferential removal direction of the polymer occurs, thereby leading to a high level of anisotropy in the etched feature shapes in the exposed first material layer.

68. The method of claim 58, wherein oxygen gas is added to the plasma to modify etch rate, mask selectivity, and anisotropy of the etched features in the first material layer, and wherein anisotropy is verticality and shape of the sidewalls.

69. The method of claim 58, wherein the depth of the etch in the first material layer is between 10 microns to 1 millimeter.

70. The method of claim 58, wherein the depth of the etch in the first material layer is less than 10 microns.

71. The method of claim 58, wherein the depth of the etch in the first material layer is more than 1 millimeter.

72. The method of claim 58, wherein the etch features in the first material layer has an aspect ratio of between 1 to 1 and 10 to 1.

73. The method of claim 58, wherein the etch in the first material layer has an aspect ratio of less than 1 to 1.

74. The method of claim 58, wherein the etch in the first material layer has an aspect ratio of more than 10 to 1.

75. The method of claim 58, wherein the third material layer is comprised of one or more metals selected from a group consisting of nickel, gold, brass, copper, silver, titanium, tungsten, and chrome.

76. The method of claim 75, wherein the third material layer is comprised of copper and has a negligible etch rate.

77. The method of claim 76, wherein the third material layer is comprised of copper and has a large ratio of the etch rate of the first material layer to the etch rate of copper.

78. The method of claim 75, wherein the third material layer is deposited onto the first material layer using electrochemical plating or physical vapor deposition.

79. The method of claim 75, wherein the third material layer is patterned into a reverse image of features to be etched on the first material layer by performing photolithography and etching on the third material layer.

80. The method of claim 75, wherein a polymer layer is patterned into a reverse image of features to be etched on the first material layer by performing photolithography, and the third material layer is deposited in a polymer mold using electrochemical plating and then the polymer mold is removed leaving the third material layer patterned in a predetermined pattern.

81. The method of claim 58, wherein the third material layer is made of semiconductor from one of more of the following types: silicon, germanium, or silicon carbide.

82. The method of claim 81, wherein the third material layer is bonded to the first material layer and then patterned and etched into the desired reverse pattern of the desired etched features in the first material layer.

83. The method of clam 81, wherein the third material layer is deposited onto the first material layer and then patterned and etched into the desired reverse pattern of the desired etched features in the first material layer.

84. The method of claim 58, wherein the third material layer is made of ceramic from one of more of the following types: alumina; tungsten carbide; or chromium carbide.

85. The method of claim 84, wherein the third material layer is bonded to the first material layer and then patterned and etched into the desired reverse pattern of the desired etched features in the first material layer.

86. The method of claim 84, wherein the third material layer is deposited onto the first material layer and then patterned and etched into the desired reverse pattern of the desired etched features in the first material layer.

87. The method of claim 58, wherein the second material substrate is comprised of a metal, semiconductor, silicon dioxide, or ceramic material layer.

88. The method of claim 87, wherein the second material substrate comprised of silicon dioxide from one or more of the material types including: fused silica, glass, quartz, fused quartz, borosilicate glass, or any material type that is mostly comprised of silicon dioxide.

89. The method of claim 87, wherein the second material substrate comprised of ceramic from one or more of the following types: alumina; tungsten carbide; or chromium carbide.

90. The method of claim 87, wherein the second material substrate is made of one or more semiconductor materials selected from the group consisting of silicon, germanium, and silicon carbide.

91. The method of claim 87, wherein the second material substrate is made of one or more metals selected from the group consisting of copper, brass, stainless steel, nickel, tungsten, brass, and titanium.

92. The method of claim 58, wherein the fourth material layer is comprised of a metal, semiconductor, or ceramic material layer.

93. The method of claim 92, wherein the fourth material layer is comprised of one or more metals selected from the group consisting of copper; stainless steel; nickel; chrome; tungsten; brass; titanium, and a combination of such metals that have been laminated or alloyed together, whether in single crystal or polycrystalline form.

94. The method of claim 93, wherein the fourth material layer is deposited onto the first material layer using electrochemical plating or physical vapor deposition.

95. The method of claim 93, wherein the fourth material layer is patterned into a reverse image of features to be etched on the first material layer by performing photolithography and etching of the fourth material layer.

96. The method of claim 93, wherein a polymer layer is patterned into a reverse image of features to be etched on the first material layer by performing photolithography and the fourth material layer is deposited in a polymer mold using electrochemical plating and then the polymer mold is removed leaving a predetermined patterned fourth material layer.

97. The method of claim 92, wherein the fourth material layer is made of one or more semiconductor materials selected from the group consisting of silicon; germanium; silicon carbide; gallium arsenide; gallium nitride; lithium niobate; and any known semiconductor material, whether in single crystal or polycrystalline form.

98. The method of claim 97, wherein the fourth material layer is bonded to the first material layer and then patterned and etched into a predetermined reverse pattern of predetermined etched features in the first material layer.

99. The method of clam 97, wherein the fourth material layer is deposited onto the first material layer and then patterned and etched into a predetermined reverse pattern of predetermined etched features in the first material layer.

100. The method of claim 92, wherein the fourth material layer is made of one or more ceramic materials selected from the group consisting of aluminum oxide, alumina, titanium nitride, tungsten carbide; chromium carbide; and any known ceramic material, whether in single crystal or polycrystalline form.

101. The method of claim 100, wherein the fourth material layer is bonded to the first material layer and then patterned and etched into a predetermined reverse pattern of predetermined etched features in the first material layer.

102. The method of claim 100, wherein the fourth material layer is deposited onto the first material layer and then patterned and etched into a predetermined reverse pattern of predetermined etched features in the first material layer.

103. The method of claim 58, wherein an etch recipe is used for etching the first material layer, the etch recipe being comprised of a Radio Frequency (RF) bias power on the substrate being etched of between 175 and 225 Watts, a chuck temperature of between 5 and 20 degrees Celsius, an Oxygen (O2) gas flow rate of between 0 and 30 standard cubic centimeters per minute (sccm), a etch chamber gas pressure of between 0 and 15 milliTorr, a perflouropropane ($C_3F_8$) gas flow rate of between 10 and 60 standard cubic centimeters per minute (sccm), a Radio Frequency (RF) antenna power to create the plasma of between 1500 and 2500 Watts, a top magnet current of between 4 and 8 Amps, a center magnet current of 8 and 12 Amps, a bottom magnet current of between 4 and 8 Amps, a heat shield temperature of between 100 and 200 degrees-Celsius, and a Helium gas substrate cooling pressure of between 2 and 20 Pascals.

104. The method of claim 103, wherein the recipe for etching the first material layer is further comprised of an etch cycle time of between 15 and 60 minutes, and an Oxygen (O2) clean cycle time of between 30 seconds and 10 minutes.

105. The method of claim 103, wherein an etch recipe to achieve a maximum etch rate in the first material layer is comprised of a Radio Frequency (RF) bias power of between 190 and 210 Watts, a chuck temperature of between 14 and 16 degrees Celsius, an Oxygen (O2) gas flow rate of between 14 and 16 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.4 Amps, a bottom magnet current of between 5.9 and 6.3 Amps, a heat shield temperature of between 140 and 160 degrees-Celsius, and a Helium gas substrate cooling pressure of between 3 and 7 Pascals.

106. The method of claim 105, wherein the etch recipe for etching the first material layer is further comprised of an etch cycle time of between 15 and 60 minutes, and an Oxygen (O2) clean cycle time of between 30 seconds and 10 minutes.

107. The method of claim 103, wherein an etch recipe is used to etch the first material layer to thereby achieve the maximum mask selectivity, the etch recipe being comprised of a Radio Frequency (RF) bias power on the substrate being etched of between 190 and 210 Watts, a substrate temperature of between 7 and 11 degrees Celsius, an Oxygen (O2) gas flow rate of between 0 and 5 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

108. The method of claim 107, wherein the recipe for etching the first material layer is further comprised of an etch cycle time of between 15 and 60 minutes, and an Oxygen (O2) clean cycle time of between 30 seconds and 10 minutes.

109. The method of claim 103, wherein an etch recipe is used to etch the first material layer to thereby achieve the maximum etch rate and vertical or near vertical etch feature sidewalls, the etch recipe being comprised of a Radio Frequency (RF) bias power on the substrate being etched of between 190 and 210 Watts, a substrate temperature of between 14 and 16 degrees Celsius, an Oxygen (O2) gas flow rate of between 8 and 10 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

110. The method of claim 109, wherein the etch recipe for etching the first material layer is further comprised of an etch cycle time of between 15 and 60 minutes, and an Oxygen (O2) clean cycle time of between 30 seconds and 10 minutes.

111. The method of claim 103, wherein an etch recipe for etching the first material layer to thereby achieve the maximum mask selectivity and vertical or nearly vertical etch feature sidewalls, the etch recipe being comprised of a Radio Frequency (RF) bias power on the substrate being etched of between 106 and 126 Watts, a substrate temperature of between 14 and 16 degrees Celsius, an Oxygen (O2) gas flow rate of between 14 and 15 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

112. The method of claim 111, wherein the etch recipe for etching the first material layer is further comprised of an etch cycle time of between 15 and 60 minutes, and an Oxygen (O2) clean cycle time of between 30 seconds and 10 minutes.

113. The method of claim 58, wherein the third material layer on the first material layer, when functioning as the etch mask, does not cover more than 99% of the first material layer surface.

114. The method of claim 58, wherein the third material layer on the first material layer, when functioning as the etch mask, does not cover more than 75% of the first material layer surface.

115. The method of claim 58, wherein the third material layer on the first material layer, when functioning as the etch mask, does not cover more than 50% of the first material layer surface.

116. The method of claim 58, wherein the third material layer on the first material layer, when functioning as the etch mask, does not cover more than 25% of the first material layer surface.

117. The method of claim 58, wherein the third material layer on the first material layer, w when functioning as the etch mask, does not cover more than 5% of the first material layer surface.

118. The method of claim 58, wherein the third material layer on the first material layer, when functioning as the etch mask, covers 5% or less of the first material layer surface.

119. The method of claim 58, wherein the dimensions of the openings in the third material layer on the first material layer, where the third material layer functions as the etch mask, have approximately identical widths across the substrate.

120. The method of claim 58, wherein the walls inside the etch chamber are periodically cleaned.

121. The method of claim 58, wherein the walls inside the etch chamber are mechanically scrubbed with an abrasive pad, wiped down with a solvent, and have an oxygen plasma clean performed between every substrate etch.

122. The method of claim 58, wherein the walls inside the etch chamber are mechanically scrubbed with an abrasive pad, wiped down with a solvent, and have an oxygen plasma clean performed between every 5 substrate etches.

123. The method of claim 58, wherein the third material layer that is used as the etch mask has a thickness of at least the value found by dividing the etched feature depth by the etch mask selectivity and multiplying by two, to thereby avoid faceting in the first material layer being etched.

124. The method of claim 58, wherein the third material layer is removed after the etch in the first material layer to a predetermined depth has been obtained.

125. The method of claim 58, wherein the fourth material layer is partially removed after the etch in the first material layer to a predetermined depth has been obtained.

126. The method of claim 58, wherein the fourth material layer is removed after the etch in the first material layer to a predetermined depth has been obtained.

127. The method of claim 58, wherein the fourth material layer is comprised of a plurality of material layers of different material types, each material layer having a respective predetermined thickness.

128. The method of claim 127, wherein the fourth material layer is comprised of one or more material types selected from the group consisting of semiconductors; metals; and ceramics.

129. The method of claim 128, wherein the fourth material layer is comprised of one or more selected from the group consisting of nickel, gold, copper, silver, titanium, tungsten, chrome, silicon, germanium, silicon carbide, alumina; tungsten carbide; and chromium carbide.

130. The method of claim 58, wherein the depth of the etch performed into the first material layer completely goes through the predetermined thickness of the first material layer.

131. The method claim 130, wherein the first material layer is removed from the second substrate material after the etch to a predetermined depth has been performed.

132. A method of making deep, high-aspect ratio features into a substrate formed from a first material comprised of silicon dioxide, the method comprising:
selecting the first material substrate so as to be of a predetermined thickness;
fabricating a predetermined second material hard etch mask layer on the surface of the first material substrate of a predetermined thickness, wherein the second material hard etch mask layer has a predetermined inverse pattern of features to be etched into the first material substrate, the second material hard etch mask layer being comprised of a ceramic, semiconductor or metal material; and
performing, without the presence of a hydrogen containing process gas, a deep, high-aspect ratio Inductively-Coupled Plasma (ICP) etch into exposed regions of the first material substrate to a predetermined depth of at least 2 microns using an ICP etch system configured with an electromagnetic neutral loop comprised of at least three (3) magnetic coils to provide a uniform etch of the first material layer across the substrate surface,
wherein the material-type and predetermined thickness of the second material hard etch mask layer allow the etch mask to persist until the predetermined etch depth into the first material layer is obtained.

133. The method of claim 132, wherein the first material substrate is comprised of silicon dioxide having a thickness of between 2 microns and several millimeters, and is a material type selected from the group consisting of fused silica; glass; quartz; fused quartz; borosilicate glass; or any material type the majority of which is comprised of silicon dioxide.

134. The method of claim 132, wherein the first material substrate is comprised of silicon dioxide is a crystal, has some crystal structure, or is amorphous.

135. The method of claim 132, wherein the first material substrate is mostly comprised of silicon dioxide material having any type or amount of additives incorporated in the silicon dioxide material.

136. The method of claim 132, wherein the Inductively-Coupled Plasma (ICP) etch system is comprised of a Radio Frequency (RF) antenna operating at a frequency of 13.56 MHz that creates an electromagnetic field within a process chamber where the etching is performed.

137. The method of claim 132, wherein the Inductively-Coupled Plasma (ICP) etch system is comprised of a separate Radio Frequency (RF) electromagnetic field applied to the chuck on which the first material substrate is positioned during etching to obtain a high plasma density and high levels of etch anisotropy in the first material substrate.

138. The method of claim 137, wherein the separate Radio Frequency (RF) electromagnetic field applied to the chuck has a frequency of 13.56 MHz.

139. The method of claim 132, wherein the Inductively-Coupled Plasma (ICP) etcher is comprised of an electromagnetic neutral loop, which is comprised of magnetic coils, and which enables spatial redistribution of ions in the plasma to enhance etching uniformity of the first material substrate.

140. The method of claim 132, wherein the etch process uses perflouropropane ($C_3F_8$) as the reactive gas for a plasma that is used to etch the first material substrate.

141. The method of claim 140, wherein the etch process occurs as a complex interaction between ions in the plasma and the first material substrate to form a complex fluorocarbon polymer on the exposed first material substrate, and wherein due to the directionality of the incoming ions, a preferential removal direction of the polymer occurs, thereby leading to a high level of anisotropy in the etched feature shapes in the exposed first material substrate.

142. The method of claim 132, wherein oxygen gas is added to the plasma to modify the etch rate, mask selectivity, and anisotropy of the etched features in the first material substrate, and wherein anisotropy is verticality and shape of the sidewalls.

143. The method of claim 132, wherein the depth of the etch in the first material substrate is between 10 microns to 1 millimeter.

144. The method of claim 132, wherein the depth of the etch in the first material substrate is less than 10 microns.

145. The method of claim 132, wherein the depth of the etch in the first material substrate is more than 1 millimeter.

146. The method of claim 132, wherein the aspect ratio of the etch features in the first material substrate is between 1 to 1 and 10 to 1.

147. The method of claim 132, wherein the etch in the first material substrate has aspect ratio of less than 1 to 1.

148. The method of claim 132, wherein the etch in the first material substrate has aspect ratio of more than 10 to 1.

149. The method of claim 132, wherein the etch mask material layer is comprised of one or more metals selected from the group consisting of nickel, gold, brass, copper, silver, titanium, tungsten, and chrome.

150. The method of claim 149, wherein the etch mask material layer comprised of copper has a negligible etch rate.

151. The method of claim 150, wherein the etch mask material layer comprised of copper has a large ratio of the etch rate of the first material substrate to the etch rate of copper.

152. The method of claim 149, wherein the etch mask material layer is deposited onto the first material substrate using electrochemical plating or physical vapor deposition.

153. The method of claim 149, wherein the etch mask material layer is patterned into a reverse image of features to be etched on the first material substrate by performing photolithography and etching on the etch mask material layer.

154. The method of claim 149, wherein a polymer layer is patterned into a reverse image of features to be etched on the first material substrate by performing photolithography and the etch mask material layer is deposited in the polymer mold using electrochemical plating and then the polymer mold is removed leaving the etch mask material layer patterned in accordance with a predetermined pattern.

155. The method of claim 132, wherein the etch mask material layer is made of one or more semiconductor materials selected from the group consisting of silicon, germanium, and silicon carbide.

156. The method of claim 155, wherein the etch mask material layer is bonded to the first material substrate and then patterned and etched into a predetermined reverse pattern of t predetermined etched features in the first material substrate.

157. The method of clam 155, wherein the etch mask material layer is deposited on the first material substrate and then patterned and etched into a predetermined reverse pattern of predetermined etched features in the first material substrate.

158. The method of claim 132, wherein the etch mask material layer is made of one of more ceramics selected from the group consisting of alumina; tungsten carbide; and chromium carbide.

159. The method of claim 158, wherein the etch mask material layer is bonded to the first material substrate and then patterned and etched into a predetermined reverse pattern of predetermined etched features in the first material substrate.

160. The method of claim 158, wherein the etch mask material layer is deposited on the first material substrate and then patterned and etched into a predetermined reverse pattern of predetermined etched features in the first material substrate.

161. The method of claim 132, wherein an etch recipe is used for etching the first material substrate, the etch recipe being comprised of a Radio Frequency (RF) bias power of between 175 and 225 Watts, a chuck temperature of between 5 and 20 degrees Celsius, an Oxygen (O2) gas flow rate of between 0 and 30 standard cubic centimeters per minute (sccm), a etch chamber gas pressure of between 1 and 15 milliTorr, a perflouropropane ($C_3F_8$) gas flow rate of between 10 and 60 standard cubic centimeters per minute (sccm), a Radio Frequency (RF) antenna power to create the plasma of between 1500 and 2500 Watts, a top magnet current of between 4 and 8 Amps, a center magnet current of 8 and 12 Amps, a bottom magnet current of between 4 and 8 Amps, a heat shield temperature of between 100 and 200 degrees-Celsius, and a Helium gas substrate cooling pressure of between 2 and 20 Pascals.

162. The method of claim 161, wherein the etch recipe for etching the first material substrate is further comprised of an etch cycle time of between 15 and 60 minutes, and an Oxygen (O2) clean cycle time of between 30 seconds and 10 minutes.

163. The method of claim 161, wherein an etch recipe to achieve a maximum etch rate in the first material substrate is comprised of a Radio Frequency (RF) bias power of between 190 and 210 Watts, a chuck temperature of between 14 and 16 degrees Celsius, an Oxygen (O2) gas flow rate of between 14 and 16 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.4 Amps, a bottom magnet current of between 5.9 and 6.3 Amps, a heat shield temperature of between 140 and 160 degrees-Celsius, and a Helium gas substrate cooling pressure of between 3 and 7 Pascals.

164. The method of claim 163, wherein the etch recipe for etching the first material substrate is further comprised of an etch cycle time of between 15 and 60 minutes, and an Oxygen (O2) clean cycle time of between 30 seconds and 10 minutes.

165. The method of claim 161, wherein an etch recipe is used to etch the first material substrate to thereby achieve a maximum mask selectivity, the etch recipe being comprised of a Radio Frequency (RF) bias power on the substrate being etched of between 190 and 210 Watts, a substrate temperature of between 7 and 11 degrees Celsius, an Oxygen (O2) gas flow rate of between 0 and 5 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

166. The method of claim 165, wherein the etch recipe for etching the first material substrate is further comprised of an etch cycle time of between 15 and 60 minutes, and an Oxygen (O2) clean cycle time of between 30 seconds and 10 minutes.

167. The method of claim 161, wherein an etch recipe is used to etch the first material substrate to thereby achieve a maximum etch rate and vertical or near vertical etch feature sidewalls, the etch recipe being comprised of a Radio Frequency (RF) bias power on the substrate being etched of between 190 and 210 Watts, a substrate temperature of between 14 and 16 degrees Celsius, an Oxygen (O2) gas flow rate of between 8 and 10 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

168. The method of claim 167, wherein the etch recipe for etching the first material substrate is further comprised of an etch cycle time of between 15 and 60 minutes, and an Oxygen (O2) clean cycle time of between 30 seconds and 10 minutes.

169. The method of claim 161, wherein etch recipe is used to etch the first material substrate to thereby achieve a maximum mask selectivity and vertical or nearly vertical etch feature sidewalls, the etch recipe being comprised of a Radio Frequency (RF) bias power on the substrate being etched of between 106 and 126 Watts, a substrate temperature of between 14 and 16 degrees Celsius, an Oxygen (O2) gas flow rate of between 14 and 15 standard cubic centimeters per minute (sccm), a etch chamber gas pressure of between 4 and 6 milliTorr, a perflouropropane ($C_3F_8$) gas flow rate of between 28 and 32 standard cubic centimeters per minute (sccm), a Radio Frequency (RF) antenna power to create the plasma of between 1900 and 2000 Watts, a top magnet current of between 5.9 and 6.3 Amps, a center magnet current of between 10.0 and 10.2 Amps, a bottom magnet current of between 5.9 and 6.3 Amps, a heat shield temperature of between 140 and 160 degrees-Celsius, and a Helium gas substrate cooling pressure of between 3 and 7 Pascals.

170. The method of claim 169, wherein the etch recipe for etching the first material layer is further comprised of an etch cycle time of between 15 and 60 minutes, and an Oxygen (O2) clean cycle time of between 30 seconds and 10 minutes.

171. The method of claim 132, wherein the second material layer etch mask on the first material substrate does not cover more than 99% of the first material substrate surface.

172. The method of claim 132, wherein the second material layer etch mask on the first material substrate does not cover more than 5% of the first material substrate surface.

173. The method of claim 132, wherein the second material layer etch mask on the first material substrate does not cover more than 50% of the first material substrate surface.

174. The method of claim 132, wherein the second material layer etch mask on the first material substrate does not cover more than 25% of the first material substrate surface.

175. The method of claim 132, wherein the second material layer etch mask on the first material substrate does not cover more than 5% of the first material substrate surface.

176. The method of claim 132, wherein the second material layer etch mask on the first material substrate covers 5% or less of the first material substrate surface.

177. The method of claim 132, wherein the dimensions of openings in the second material layer etch mask on the first material substrate have approximately identical widths across the first material substrate.

178. The method of claim 132, wherein the walls inside the etch chamber are periodically cleaned.

179. The method of claim 132, wherein the walls inside the etch chamber are mechanically scrubbed with an abrasive pad, wiped down with a solvent, and have an oxygen plasma clean performed between every substrate etch.

180. The method of claim 132, wherein the walls inside the etch chamber are mechanically scrubbed with an abrasive pad, wiped down with a solvent, and have an oxygen plasma clean performed between every 5 substrate etches.

181. The method of claim 132, wherein the second material layer etch mask has a thickness of at least a value found by dividing the etched feature depth into the first material substrate by the etch mask selectivity and multiplying by two, to thereby avoid faceting in the first material substrate that is being etched.

182. The method of claim 132, wherein the second material layer etch mask is removed after the etch in the first material substrate to a predetermined depth has been obtained.

183. The method according to claim 1 wherein argon gas is added to the plasma to modify the etch rate, mask selectivity, and anisotropy of the etched features in the first material layer, and wherein anisotropy is verticality and shape of the sidewalls.

184. The method according to claim 183 in which the argon flow rate is between 0 and 50 standard cubic centimeters per minute (sccm).

185. The method according to claim 58 wherein argon gas is added to the plasma to modify the etch rate, mask selectivity, and anisotropy of the etched features in the first material layer, and wherein anisotropy is verticality and shape of the sidewalls.

186. The method according to claim 185 in which the argon flow rate is between 0 and 50 standard cubic centimeters per minute (sccm).

187. The method according to claim 132 wherein argon gas is added to the plasma to modify the etch rate, mask selectivity, and anisotropy of the etched features in the first material layer, and wherein anisotropy is verticality and shape of the sidewalls.

188. The method according to claim 187 in which the argon flow rate is between 0 and 50 standard cubic centimeters per minute (sccm).

189. The method according to claim 18, wherein the second material layer that is comprised of copper and used as an etch mask has a thickness less than one micron, thereby affording the capability for more precise dimensional control of etch mask features, as well as the etched features, which is a high-fidelity reverse representation of the second material layer etch mask.

190. The method according to claim 77, wherein the second material layer that is comprised of copper and used as a second material layer etch mask has a thickness of less than one micron, thereby affording the capability for more precise dimensional control of etch mask features, as well as the etched features, which is a high-fidelity reverse representation of the etch mask.

191. The method according to claim 151, wherein the copper layer that is used as a second material layer etch mask has a thickness of less than one micron, thereby affording the capability for more precise dimensional control of etch mask features, as well as the etched features, which is a high-fidelity reverse representation of the etch mask.

192. The method according to claim 1, wherein the deep etch into the first material layer is between less than 2 microns and more than 100 microns.

* * * * *